(12) United States Patent
Noda et al.

(10) Patent No.: US 10,083,983 B2
(45) Date of Patent: Sep. 25, 2018

(54) SEMICONDUCTOR MEMORY DEVICE

(71) Applicant: Toshiba Memory Corporation, Minato-ku (JP)

(72) Inventors: Kotaro Noda, Yokkaichi (JP); Kyoko Noda, Yokkaichi (JP); Aya Minemura, Yokkaichi (JP); Kenji Sawamura, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/630,064

(22) Filed: Jun. 22, 2017

(65) Prior Publication Data
US 2017/0294446 A1    Oct. 12, 2017

Related U.S. Application Data

(63) Continuation of application No. 15/047,819, filed on Feb. 19, 2016, now Pat. No. 9,711,527.

(60) Provisional application No. 62/217,480, filed on Sep. 11, 2015.

(51) Int. Cl.
| | | |
|---|---|---|
| H01L 29/76 | (2006.01) | |
| H01L 27/11582 | (2017.01) | |
| H01L 27/11565 | (2017.01) | |
| H01L 29/51 | (2006.01) | |
| H01L 23/522 | (2006.01) | |
| H01L 23/528 | (2006.01) | |

(52) U.S. Cl.
CPC ...... *H01L 27/11582* (2013.01); *H01L 23/528* (2013.01); *H01L 23/5226* (2013.01); *H01L 27/11565* (2013.01); *H01L 29/513* (2013.01); *H01L 29/517* (2013.01); *H01L 29/518* (2013.01)

(58) Field of Classification Search
CPC .............. H01L 27/11582; H01L 27/11565
USPC .......................................................... 257/314
See application file for complete search history.

(56) References Cited

U.S. PATENT DOCUMENTS

| | | |
|---|---|---|
| 8,169,016 B2 | 5/2012 | Higashi |
| 8,405,141 B2 | 3/2013 | Matsuda et al. |
| 8,426,908 B2 | 4/2013 | Higashi |
| 9,711,527 B2 * | 7/2017 | Noda ................ H01L 27/11582 |
| 2011/0233648 A1 | 9/2011 | Seol et al. |
| 2013/0069140 A1 | 3/2013 | Ichinose et al. |

(Continued)

FOREIGN PATENT DOCUMENTS

| | | |
|---|---|---|
| JP | 2010-225694 | 10/2010 |
| JP | 2013-197546 | 9/2013 |

*Primary Examiner* — Anthony Ho
(74) *Attorney, Agent, or Firm* — Oblon, McClelland, Maier & Neustadt, L.L.P.

(57) ABSTRACT

According to one embodiment, a semiconductor memory device includes a substrate, a stacked body, a semiconductor pillar, a charge storage film, and at least one columnar member. The stacked body is provided on the substrate. In the stacked body, a plurality of insulating films and a plurality of electrode films are layered together alternately. The semiconductor pillar is provided in the stacked body and extends in a stacking direction of the stacked body. The charge storage film is provided between the semiconductor pillar and the stacked body. The columnar member is provided in the stacked body and extends in the stacking direction. A lower portion of the columnar member is provided in the substrate.

19 Claims, 42 Drawing Sheets

(56) References Cited

U.S. PATENT DOCUMENTS

2014/0061766 A1 3/2014 Kito et al.
2014/0070302 A1 3/2014 Yoo et al.

* cited by examiner

SEMICONDUCTOR MEMORY DEVICE

CROSS-REFERENCE TO RELATED APPLICATIONS

This application is a continuation of and claims the benefit of priority under 35 U.S.C. § 120 from U.S. Ser. No. 15/047,819 filed Feb. 19, 2016, and claims the benefit of priority from U.S. Provisional Patent Application 62/217,480 filed on Sep. 11, 2015; the entire contents of each of which are incorporated herein by reference.

FIELD

Embodiments described herein relate generally to a semiconductor memory device.

BACKGROUND

Memory devices having a three-dimensional structure in which memory holes are formed in a stacked body produced by layering together a plurality of electrode films separated by insulating films and in which silicon bodies that function as channels are formed along the sidewalls of the memory holes with charge storage films disposed therebetween have been proposed. The electrode films function as control gates in the memory cells and are formed by filling a metal or the like into cavities formed in the stacked body by removing portions thereof. In such three-dimensional memory devices, when removing portions of the stacked body and replacing those portions with a metal or the like, if any openings are left remaining, the stacked body may warp and cause the electrode films to deform.

BRIEF DESCRIPTION OF THE DRAWINGS

FIGS. 5A and 5B to FIGS. 13A and 13B illustrate a method for manufacturing the semiconductor memory device according to the first embodiment;

FIGS. 25A and 25B to FIGS. 28A and 28B illustrate a method for manufacturing the semiconductor memory device according to the fifth embodiment.

DETAILED DESCRIPTION

Figure 1:
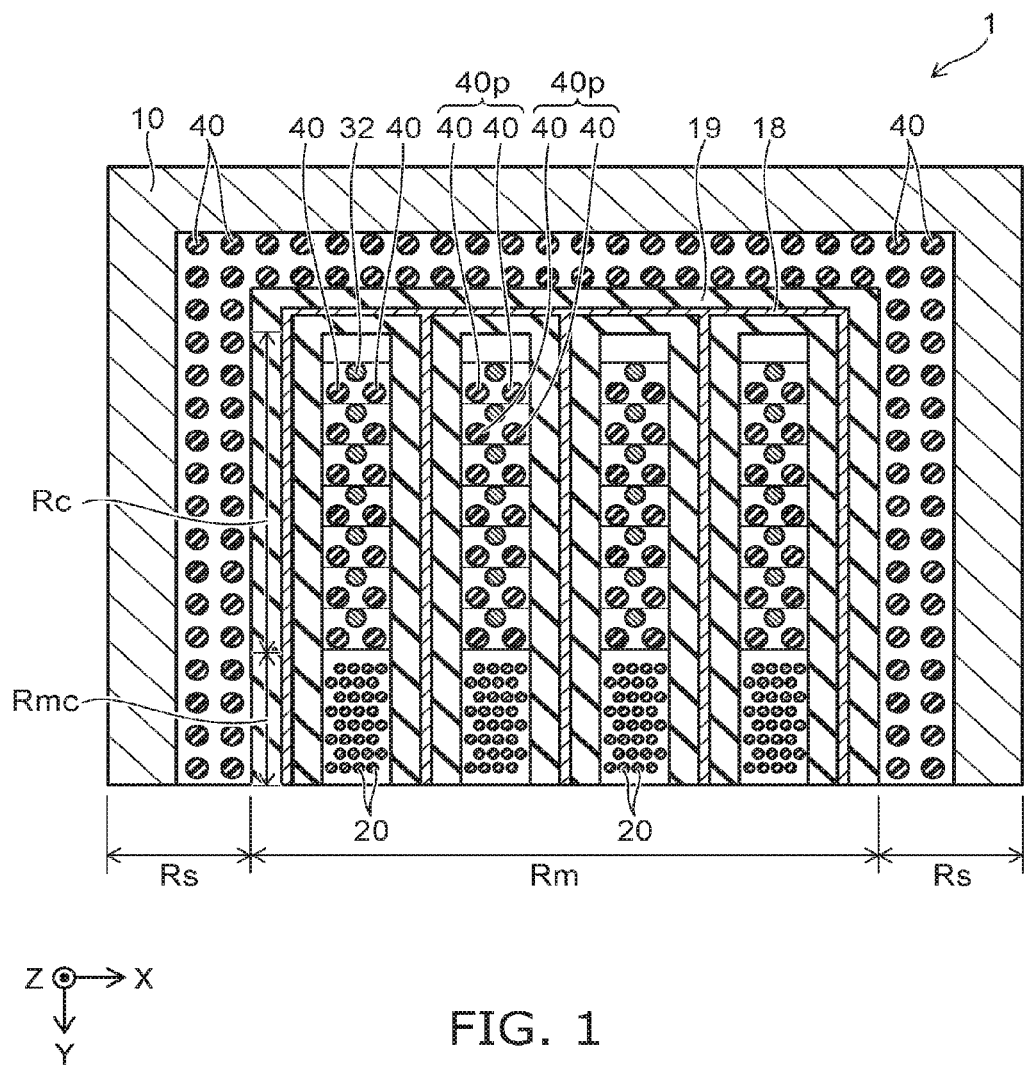
FIG. 1 is a schematic plan view of a semiconductor memory device according to a first embodiment.

According to one embodiment, a semiconductor memory device includes a substrate, a stacked body, a semiconductor pillar, a charge storage film, and at least one columnar member. The stacked body is provided on the substrate. In the stacked body, a plurality of insulating films and a plurality of electrode films are layered together alternately. The semiconductor pillar is provided in the stacked body and extends in a stacking direction of the stacked body. The charge storage film is provided between the semiconductor pillar and the stacked body. The columnar member is provided in the stacked body and extends in the stacking direction. A lower portion of the columnar member is provided in the substrate.

Embodiments will now be described with reference to the drawings. The same components in the drawings are marked with the same reference numerals.

A semiconductor memory device that has a three-dimensional structure will now be described as an example.

First Embodiment

FIG. 1 is a schematic plan view of a semiconductor memory device according to a first embodiment.

Figure 2:
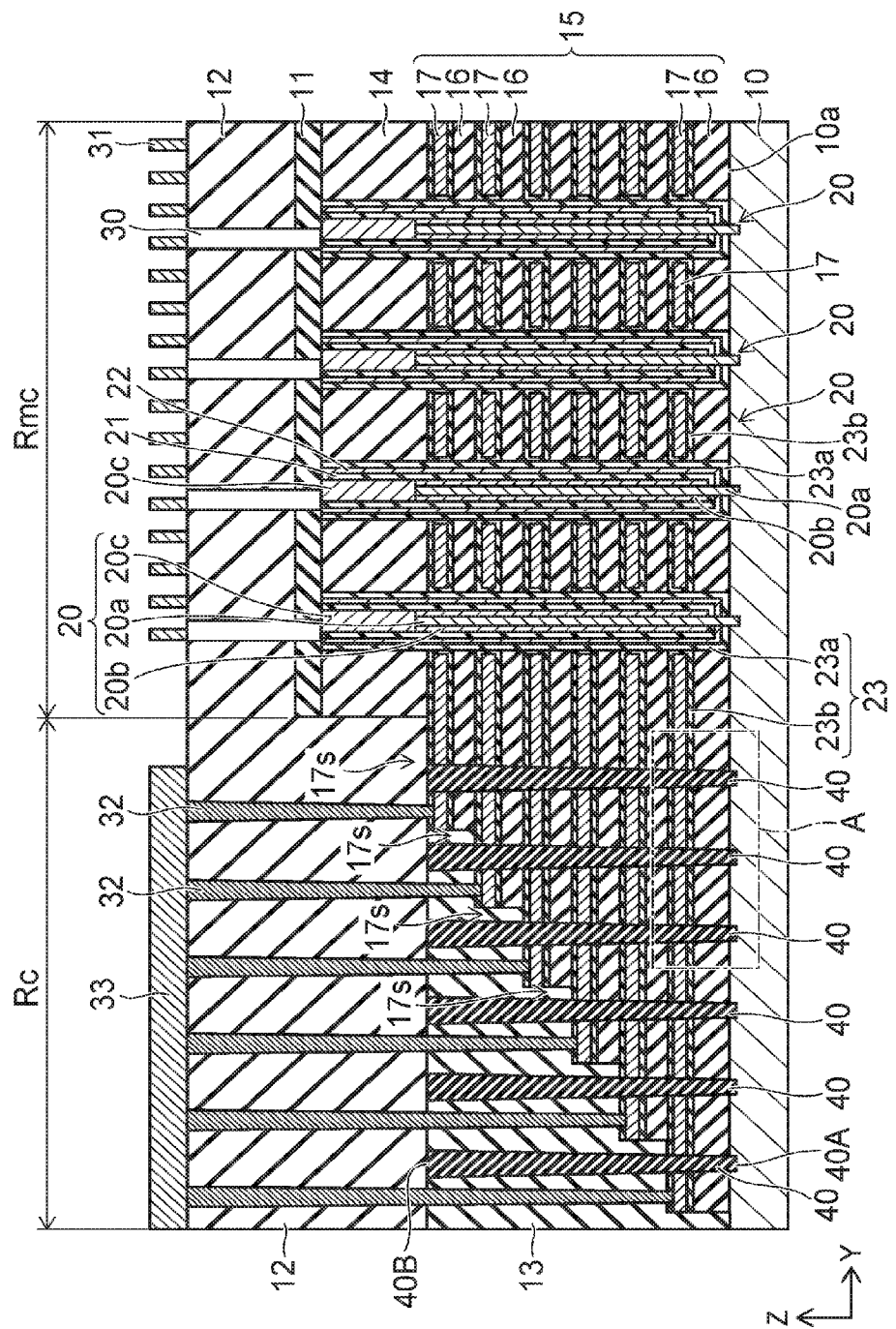
FIG. 2 is a schematic cross-sectional view of the semiconductor memory device according to the first embodiment.

FIG. 2 is a schematic cross-sectional view of the semiconductor memory device according to the first embodiment.

Figure 3:
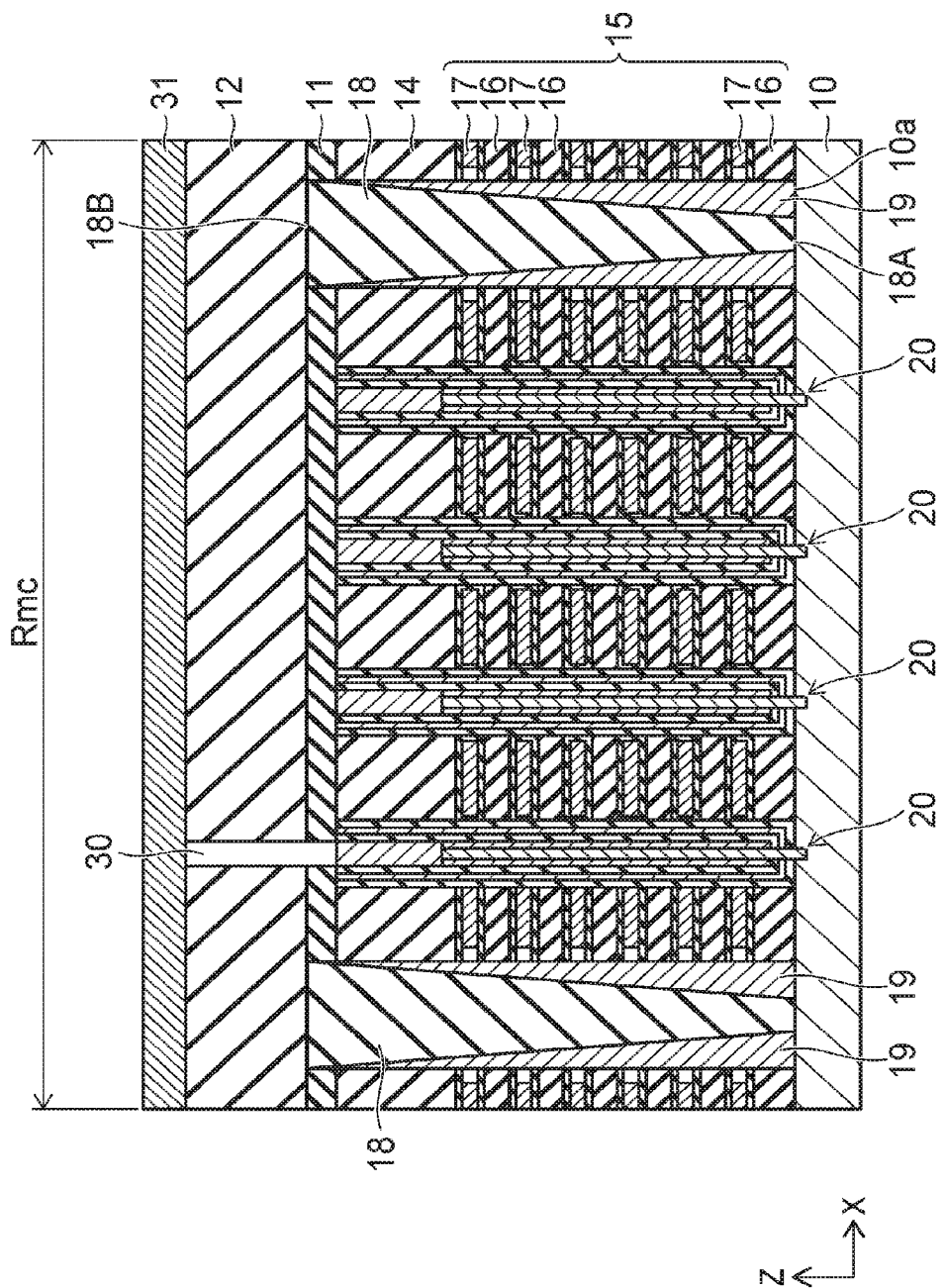
FIG. 3 is a schematic cross-sectional view of the semiconductor memory device according to the first embodiment.

FIG. 3 is a schematic cross-sectional view of the semiconductor memory device according to the first embodiment.

Figure 4:
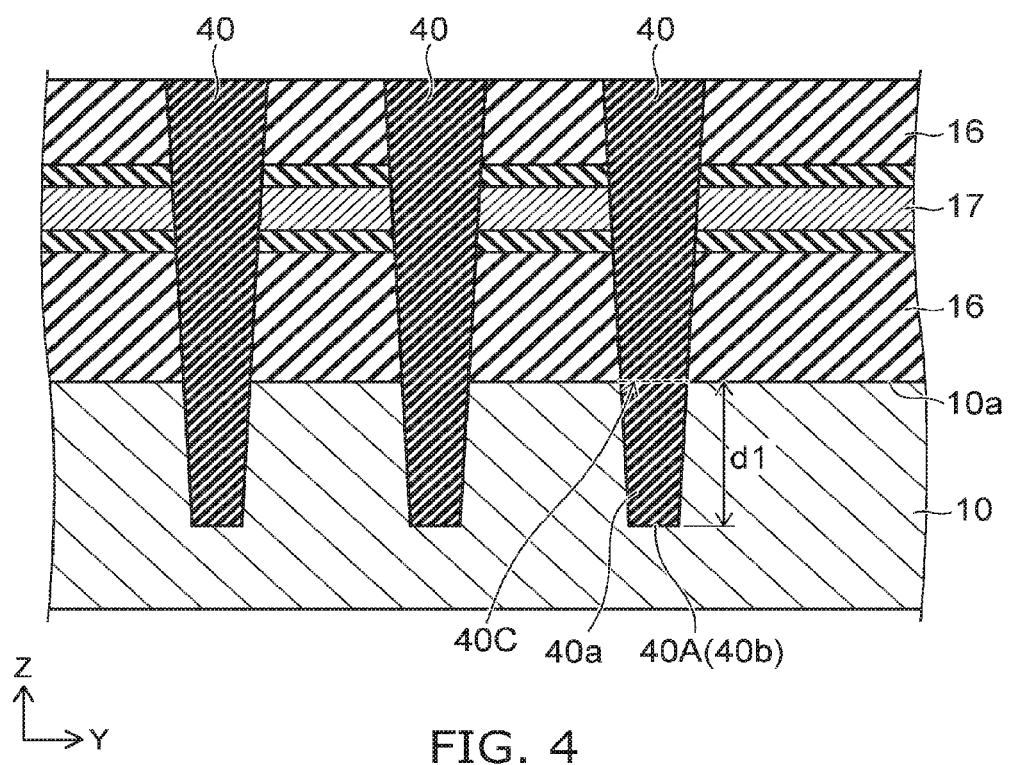
FIG. 4 is an enlarged view of a region A in FIG. 2.

FIG. 4 is an enlarged view of a region A in FIG. 2.

FIG. 1 is a plan view illustrating a semiconductor memory device 1. FIG. 2 is a Y-Z cross-sectional view of a memory region Rm of the semiconductor memory device 1. FIG. 3 is an X-Z cross-sectional view of a memory cell region Rmc of the semiconductor memory device 1. FIG. 4 is a Y-Z cross-sectional view of a contact region Rc of the semiconductor memory device 1.

In the specification, the following XYZ orthogonal coordinate system is used for the convenience of explanation. Namely, two mutually perpendicular directions parallel to a top surface 10a of a silicon substrate 10 on which the semiconductor memory device 1 is provided are defined as the X-direction and the Y-direction. Moreover, the direction orthogonal to the top surface 10a of the silicon substrate 10 is defined as the Z-direction.

As illustrated in FIG. 1, the semiconductor memory device 1 includes a memory region Rm and a peripheral region Rs. The peripheral region Rs is provided around the periphery of the memory region Rm. The peripheral region Rs is a region in which columnar members 40 are formed on top of the silicon substrate 10 and are separated therefrom by an insulating film or the like, for example. A plurality of the columnar members 40 is provided in the peripheral region Rs such that the columnar members 40 surround the memory region Rm, for example.

Next, the memory region Rm will be described.

As illustrated in FIG. 2, the memory region Rm includes the memory cell region Rmc and the contact region Rc. The memory cell region Rmc and the contact region Rc are arranged along the Y-direction.

In the memory cell region Rmc, a stacked body 15 and a plurality of silicon pillars 20 (semiconductor pillars) are provided. The stacked body 15 includes a plurality of insulating films 16 and a plurality of electrode films 17 layered together alternately in the Z-direction, and, an interlayer insulating film 14 is provided on top of the uppermost electrode film 17. The insulating film 16 is formed from, for example, silicon oxide ($SiO_2$). Each of the electrode films 17 includes a main body portion made from a material such as tungsten (W) or molybdenum (Mo) and a barrier metal layer made from a material such as titanium nitride and formed covering the surface of the main body portion.

The silicon pillars 20 extend in the Z-direction. The silicon pillars 20 go through the interlayer insulating film 14 and the stacked body 15, and the bottom ends of the silicon pillars 20 contact the silicon substrate 10. As illustrated in FIG. 1, the silicon pillars 20 are arranged in a staggered pattern, for example. The interlayer insulating film 14 is formed from silicon oxide, for example.

Each of the silicon pillars 20 includes a cylinder-shaped core portion 20a that is positioned within the stacked body 15 and forms the center portion of the silicon pillar 20, a hollow cylinder-shaped cover layer 20b provided covering the periphery of the core portion 20a, and a plug portion 20c provided above the core portion 20a and the cover layer 20b and positioned within the interlayer insulating film 14. The silicon pillars 20 are formed entirely from polysilicon. The core portion 20a may also be hollow cylinder-shaped, and an insulating member may be provided in the interior of the core portion 20a.

A tunnel insulating film 21 is provided on the periphery of each silicon pillar 20, that is, on the side surface of each silicon pillar 20. The tunnel insulating films 21 are single-layer silicon oxide films or ONO films in which a silicon oxide layer, a silicon nitride layer, and another silicon oxide layer are layered together, for example. A charge storage film 22 is provided on the periphery of each tunnel insulating film 21. The charge storage films 22 are films that store electric charge and are formed from a material that has electron trap sites such as silicon nitride ($Si_3N_4$), for example.

A silicon oxide layer 23a made from silicon oxide is provided on the periphery of each charge storage film 22. Aluminum oxide layers 23b made from aluminum oxide ($Al_2O_3$) are formed between the silicon oxide layers 23a and the electrode films 17 and between the insulating films 16 and the electrode films 17. The silicon oxide layers 23a and the aluminum oxide layers 23b form block insulating films 23. Moreover, the tunnel insulating films 21, the charge storage films 22, and the block insulating films 23 form memory films that can store electric charge. Therefore, the memory films are disposed between the silicon pillars 20 and the electrode films 17.

A plug 30 is provided in a region directly above each of the silicon pillars 20 and extends in the Z-direction through an insulating film 11 and an insulating film 12. The plugs 30 are formed from a conductive material such as tungsten, for example. The insulating film 11 and the insulating film 12 are formed from silicon oxide, for example. Bit lines 31 are formed running in the X-direction on top of the insulating film 12. Each of the bit lines 31 is connected via one of the plugs 30 to one of the silicon pillars 20 in each stacked body 15.

As illustrated in FIG. 3, a plurality of source electrodes 18 extending in the Y-direction is formed as conductive members on top of the silicon substrate 10. The plurality of source electrodes 18 is arranged along the X-direction and is separated from one another with an equal gap between each. The thickness of each of the source electrodes 18 in a cross section taken in the X-direction is smallest at the bottom end 18A, increases moving upwards, and is greatest at the top end 18B. Each of the source electrodes 18 includes a main body portion made from tungsten or molybdenum and a barrier metal layer (not illustrated in the figure) made from a material such as titanium nitride (TiN) and formed covering the surface of the main body portion. The bottom ends 18A of the source electrodes 18 contact the silicon substrate 10. Between each two adjacent source electrodes 18 in the X-direction, the stacked body 15, the interlayer insulating film 14, and the insulating film 11 are provided in that order from bottom to top. As illustrated in FIG. 1, the insulating film 11, the interlayer insulating film 14, and the stacked body 15 are divided by the source electrodes 18 and extend in the Y-direction. Therefore, the insulating films 16 and the electrode films 17 also extend in the Y-direction.

Insulating films 19 are provided between the source electrodes 18 and the structures formed by the insulating film 11, the interlayer insulating film 14, and the stacked body 15. The insulating films 19 insulate the electrode films 17 from the source electrodes 18. The insulating films 19 also extend in the Y-direction. The thickness of each insulating film 19, that is, the length in the X-direction of each insulating film 19 is greatest at the bottom end, decreases moving upwards, and is smallest at the top end. The insulating films 19 are formed from silicon oxide, for example.

Meanwhile, in the contact region Rc, the ends of the stacked body 15 are stair-shaped, with a step 17s formed for each electrode film 17. An insulating film 13 also covers the stair-shaped ends of the stacked body 15, and the top surface of the insulating film 13 is flat. The insulating films 13 are formed from silicon oxide, for example. Contacts 32 are provided on each of the steps 17s of each of the stacked bodies 15.

Each of the contacts 32 extends in the Z-direction and goes through the insulating film 12 and the insulating film 13. Each of the contacts 32 is provided near the columnar members 40. The columnar members 40 will be described in more detail later. The bottom ends of the contacts 32 are connected to the electrode films 17. In this embodiment, each of the electrode films 17 is connected to one of the contacts 32. However, each of the electrode films 17 may be connected to a plurality of contacts 32.

Upper-layer word lines 33 are provided running in the Y-direction on top of the insulating film 12. The top ends of the contacts 32 are connected to the upper-layer word lines 33. Therefore, each of the electrode films 17 is connected via one of the contacts 32 to one of the upper-layer word lines 33.

In the memory cell region Rmc, the silicon substrate 10 is connected to the bit lines 31 by the silicon pillars 20. Furthermore, a memory cell that includes a memory film is formed at each intersection between the silicon pillars 20 and the electrode films 17. In the memory cell region Rmc, a large number of the memory cells are arranged in a three-dimensional matrix in the X-direction, Y-direction, and Z-direction, and data can be stored in each memory cell. In the contact region Rc, the electrode films 17 are drawn out from the memory cell region Rmc and connected via the contacts 32 and the upper-layer word lines 33 to a peripheral circuit (not illustrated in the figures).

Next, the columnar members 40 will be described.

As illustrated in FIGS. 1 and 2, the columnar members 40 are provided in the contact region Rc. Two adjacent columnar members 40 are separated from one another along the X-direction, and a plurality of groups 40p of the two columnar members 40 is provided along the Y-direction and separated from one another. Each of the columnar members 40 is provided above each of the steps 17s of each of the stacked bodies 15 and goes through the respective insulating film 13 and stacked body 15 in the Z-direction. Here, each group 40p includes two columnar members 40, but each group 40p may include any number of columnar members 40. The columnar members 40 are formed from silicon oxide, for example.

The columnar members 40 are cylinder-shaped or polygonal column-shaped, for example. The width of each columnar member 40 in the Y-direction is smallest at the bottom end 40A, increases moving upwards, and is greatest at the top end 40B. The columnar members 40 have a tapered shape, for example. The columnar members 40 may also be formed such that the width of the top end 40B of each in the Y-direction is equal to the width of the bottom end 40A of each in the Y-direction.

As illustrated in FIG. 4, a portion of each columnar member 40 is provided in the silicon substrate 10. In other words, the lower portion 40a of each columnar member 40 is embedded in the silicon substrate 10. Here, "lower portion 40a" refers to, in the lower portion of each columnar member 40 when divided into two portions of equal length in the Z-direction, the portion positioned below the portion positioned on the same plane as the boundary (the boundary portion 40C) between the silicon substrate 10 and the insulating film 16. The bottom end 40A of each columnar member 40 (that is, the bottom end 40b of the lower portion 40a) is positioned at a depth d1 beneath the top surface 10a of the silicon substrate 10, for example. The depth d1 is greater than or equal to 10 nm, for example.

When the thickness of each columnar member 40 is smallest at the bottom end 40A and greatest at the top end 40B, the width of the boundary portion 40C of each columnar member 40 is less than the width of the top end 40B and greater than the width of the bottom end 40A.

As described above, the columnar members 40 can be provided in the peripheral region Rs, and therefore a plurality of the columnar members 40 may be provided in the peripheral region Rs such that the lower portion 40a of each columnar member 40 is embedded in the silicon substrate 10.

Next, a method for manufacturing the semiconductor memory device according to this embodiment will be described.

FIGS. 5A and 5B to FIGS. 13A and 13B illustrate a method for manufacturing the semiconductor memory device according to the first embodiment.

FIGS. 5A to 13A and FIGS. 5B to 13B are plan views and cross-sectional views, respectively, illustrating the method for manufacturing the semiconductor memory device. The plan views in FIGS. 5A to 13A are enlarged views of the plan view of the memory cell region Rmc and the contact region Rc illustrated in FIG. 1. The cross-sectional views in FIGS. 5B to 13B are enlarged views of the cross section of the memory cell region Rmc and the contact region Rc illustrated in FIG. 2. Moreover, FIGS. 5B to 13B illustrate the parts below the interlayer insulating film 14 in the memory cell region Rmc and the parts below the insulating film 12 in the contact region Rc.

Figure 5A:
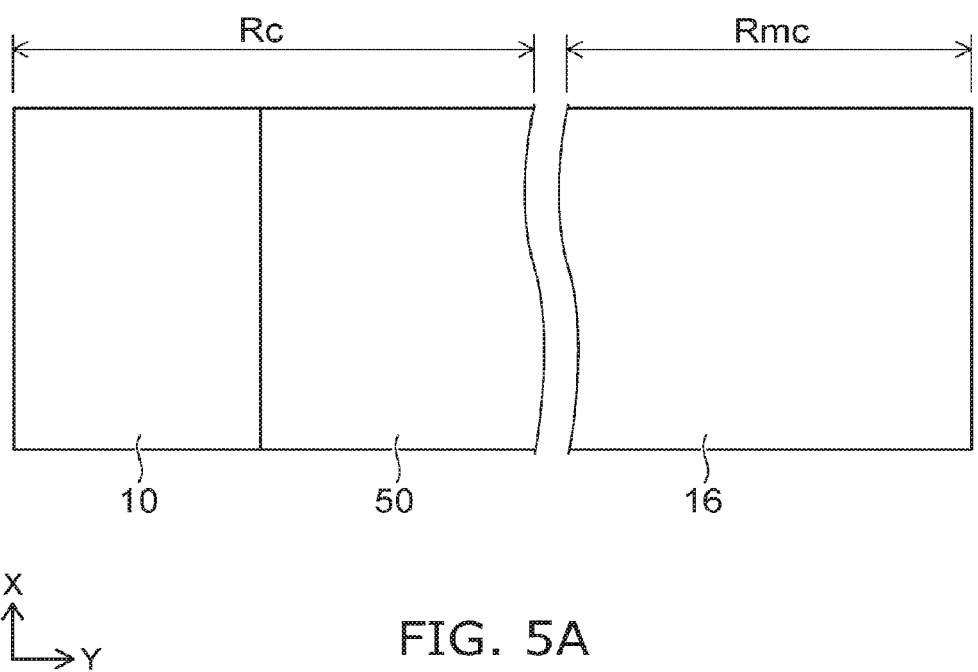
Figure 5B:
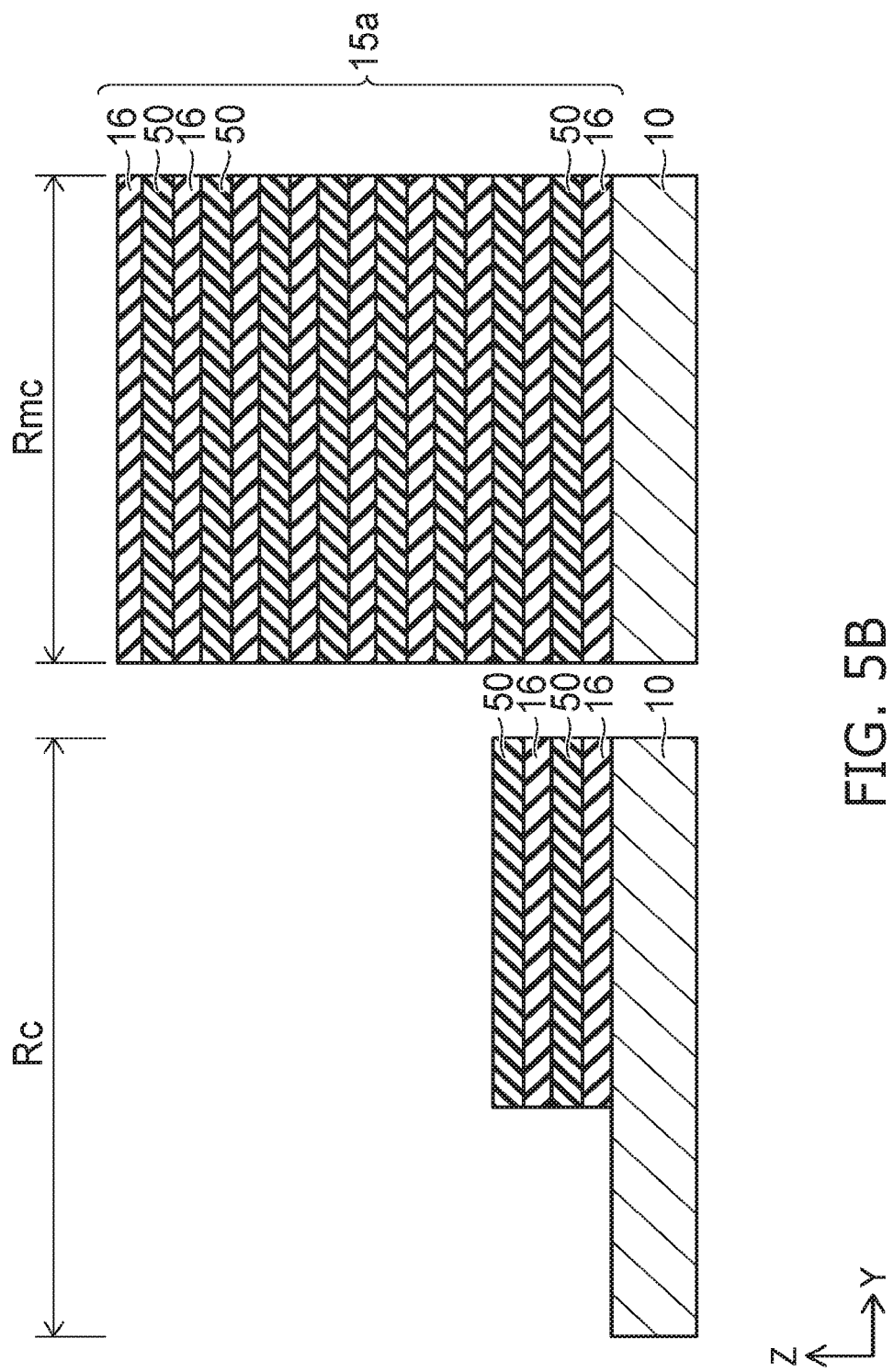

As illustrated in FIGS. 5A and 5B, insulating films 16 and sacrificial films 50 are layered alternately along the Z-direction on top of the silicon substrate 10 using a method such as chemical vapor deposition (CVD) in order to form a stacked body 15a. The insulating film 16 is formed from, for example, silicon oxide. The sacrificial films 50 are formed from a material with which sufficient etching selectivity can be achieved relative to the insulating films 16, such as silicon nitride. Next, in the memory cell region Rmc, a layer of silicon oxide, for example, is deposited on top of the stacked body 15a in order to form the interlayer insulating film 14 (not illustrated in the figures).

Figure 6A:
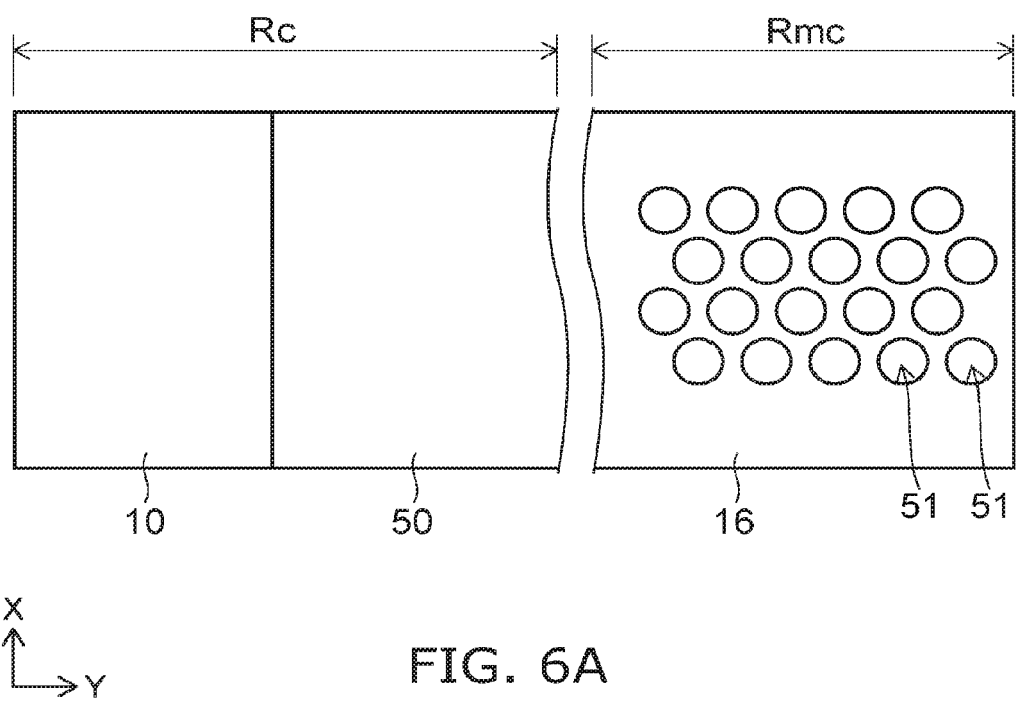
Figure 6B:
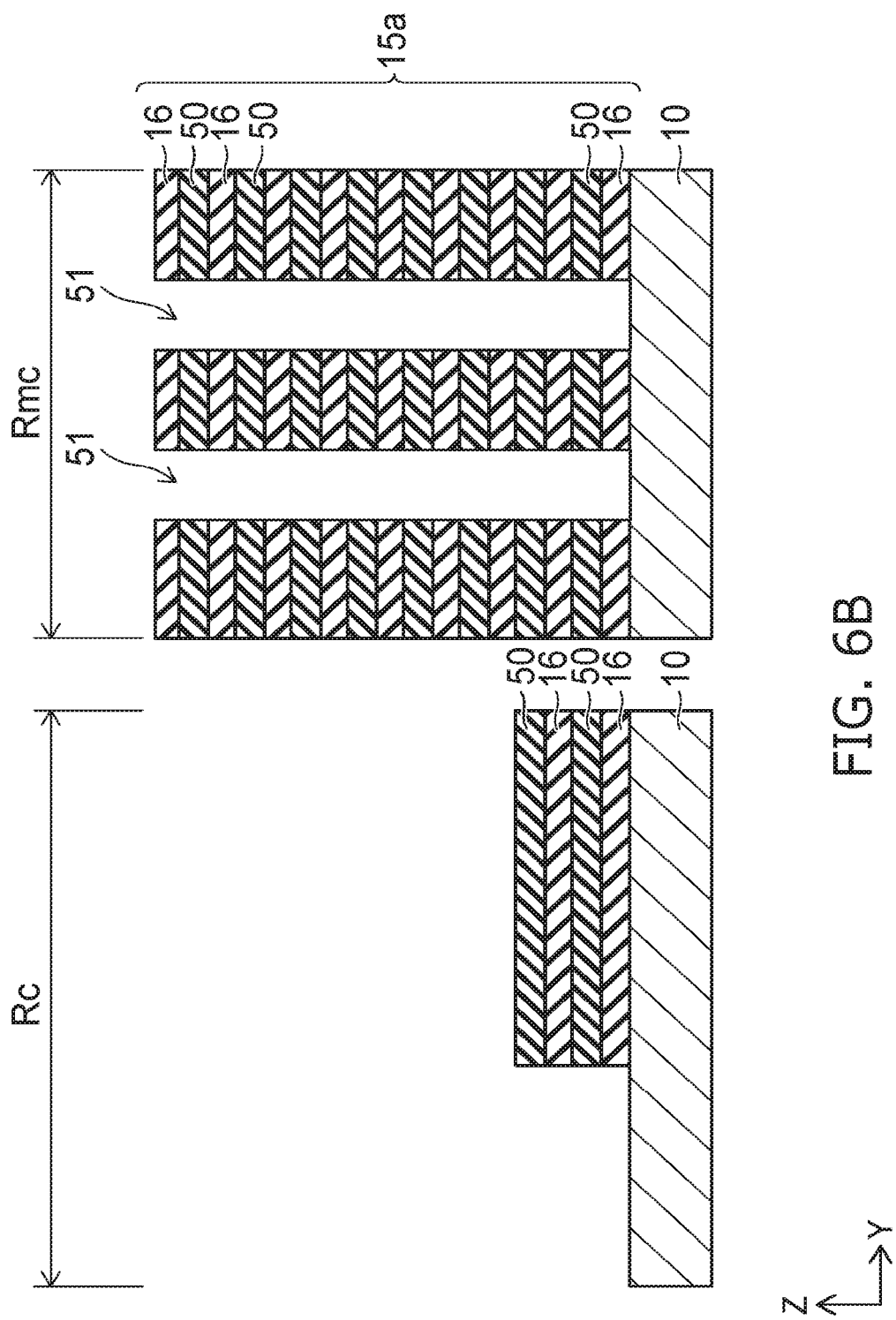

As illustrated in FIGS. 6A and 6B, memory holes 51 are formed in the stacked body 15a in the memory cell region Rmc using reactive ion etching (RIE), for example. The memory holes 51 extend in the Z-direction through the stacked body 15a and reach the silicon substrate 10. The memory holes 51 are circular when viewed from the Z-direction. Moreover, when viewed from the Z-direction, the memory holes 51 are disposed in a staggered pattern, for example.

Figure 7A:
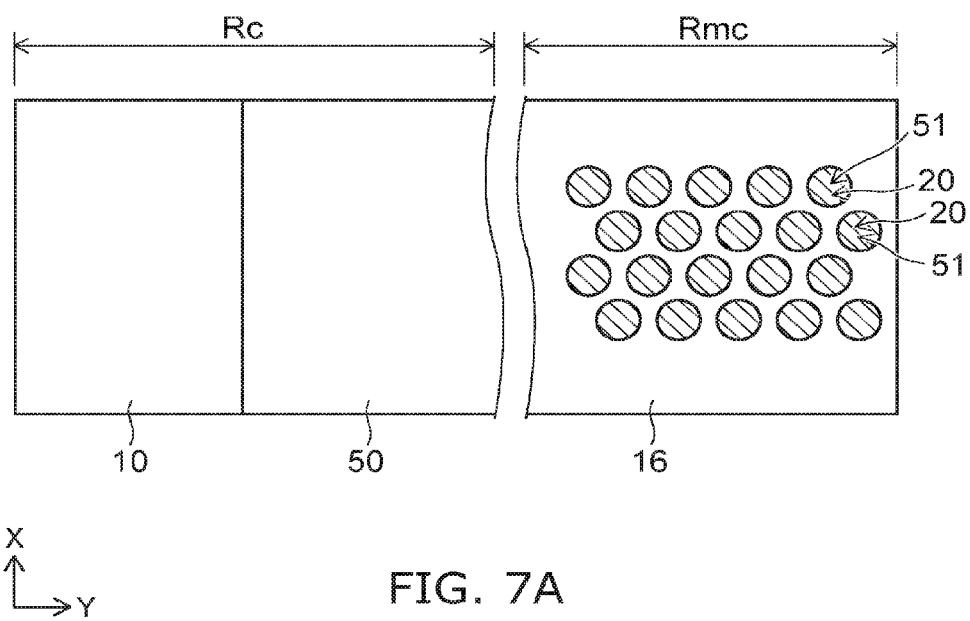
Figure 7B:
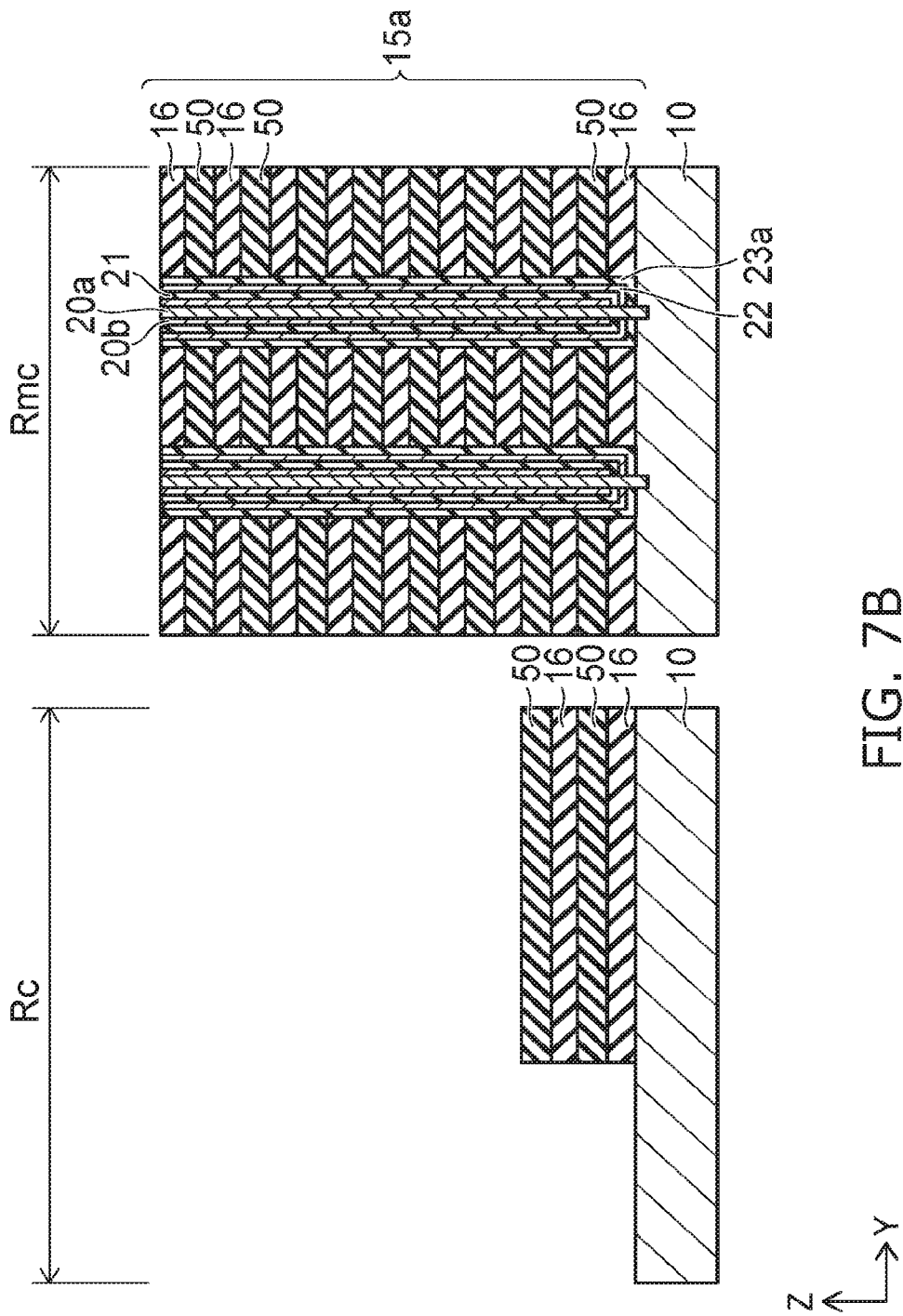

As illustrated in FIGS. 7A and 7B, in the memory cell region Rmc, a method such as CVD is used to deposit, on the inner walls of the memory holes 51, a layer of silicon oxide to form the silicon oxide layers 23a, a layer of silicon nitride to form the charge storage films 22, a layer of a material such as silicon oxide to form the tunnel insulating films 21, and a layer of silicon to form the cover layers 20b. Next, RIE is used to remove the cover layer 20b, the tunnel insulating film 21, the charge storage film 22, and the silicon oxide layer 23a at the bottom face of each memory hole 51 in order to expose the silicon substrate 10. Then, silicon is deposited to form the core portions 20a. Each core portion 20a reaches and contacts the silicon substrate 10. Next, the top portion of each cover layer 20b and each core portion 20a is removed using etching and filled with an impurity-impregnated silicon material in order to form plug portions 20c (not illustrated in the figures). This completes formation of the silicon pillars 20 in the memory holes 51.

Figure 8A:
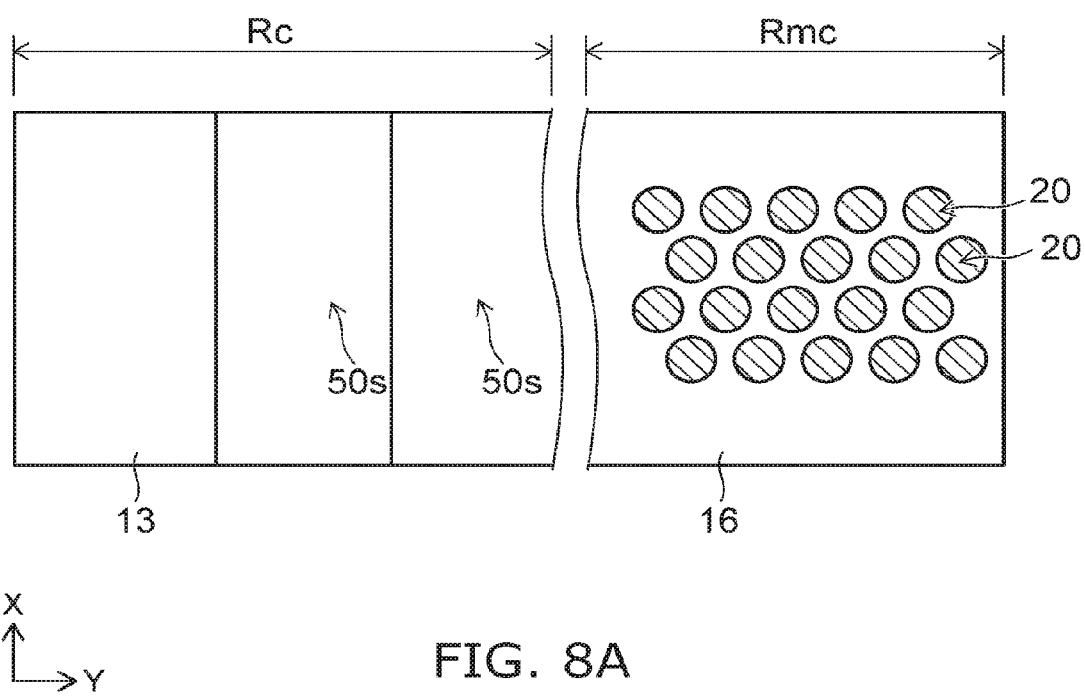
Figure 8B:
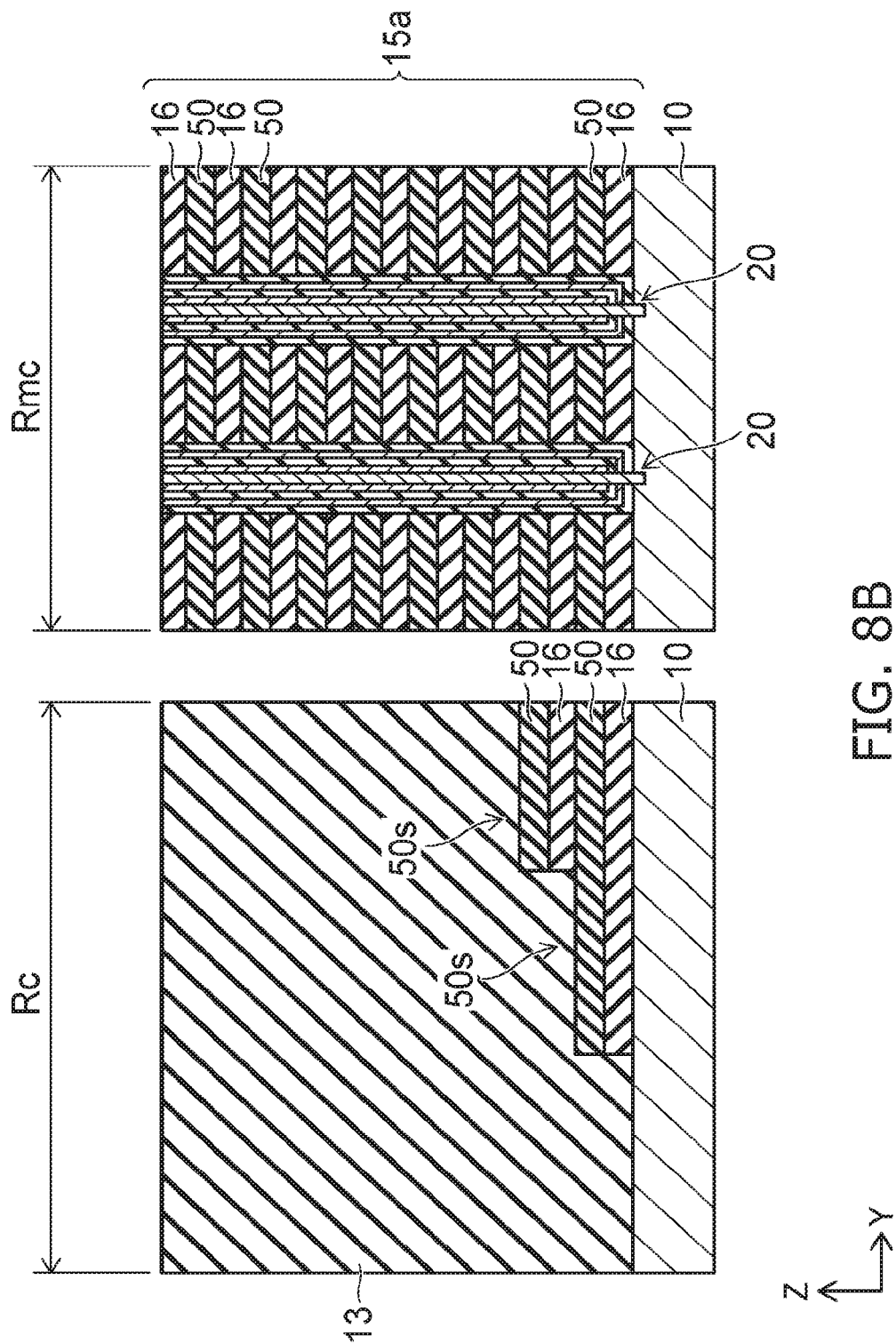

As illustrated in FIGS. 8A and 8B, in the contact region Rc, the stacked body 15a is processed into a stair shape to form a step 50s in each sacrificial film 50. Next, a layer of a material such as silicon oxide is deposited to form the insulating film 13 on top of the silicon substrate 10 such that the insulating film 13 covers the stacked body 15a. Here, the insulating film 13 is formed thick enough that the stair shape of the stacked body 15a is not apparent in the top surface of the insulating film 13.

Figure 9A:
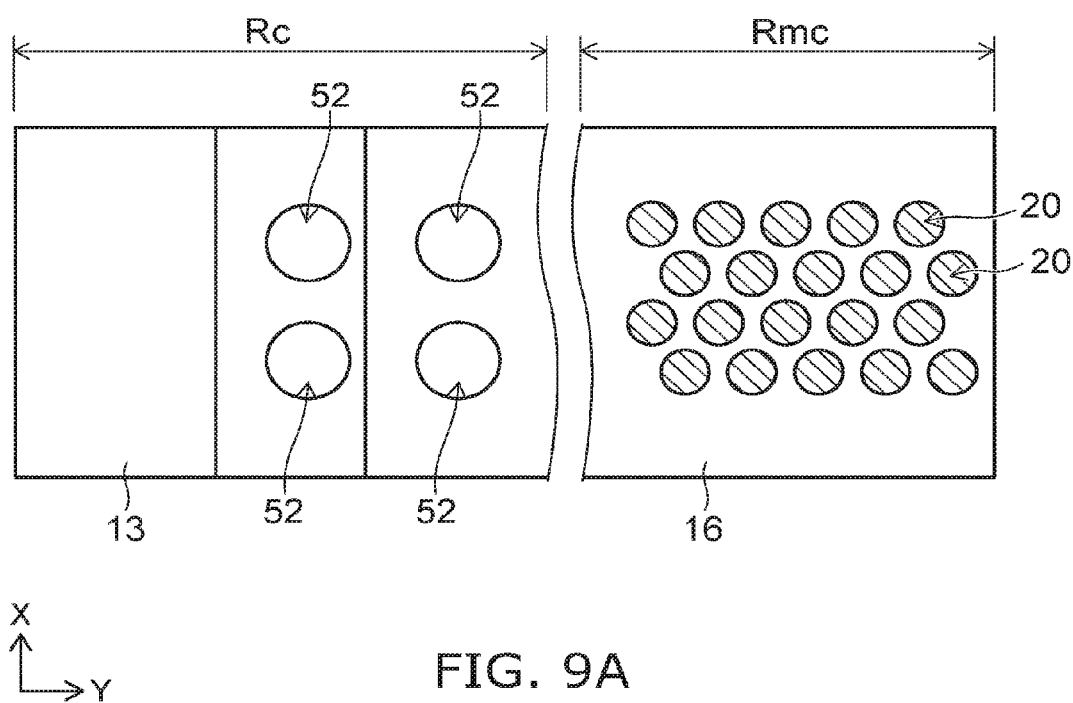
Figure 9B:
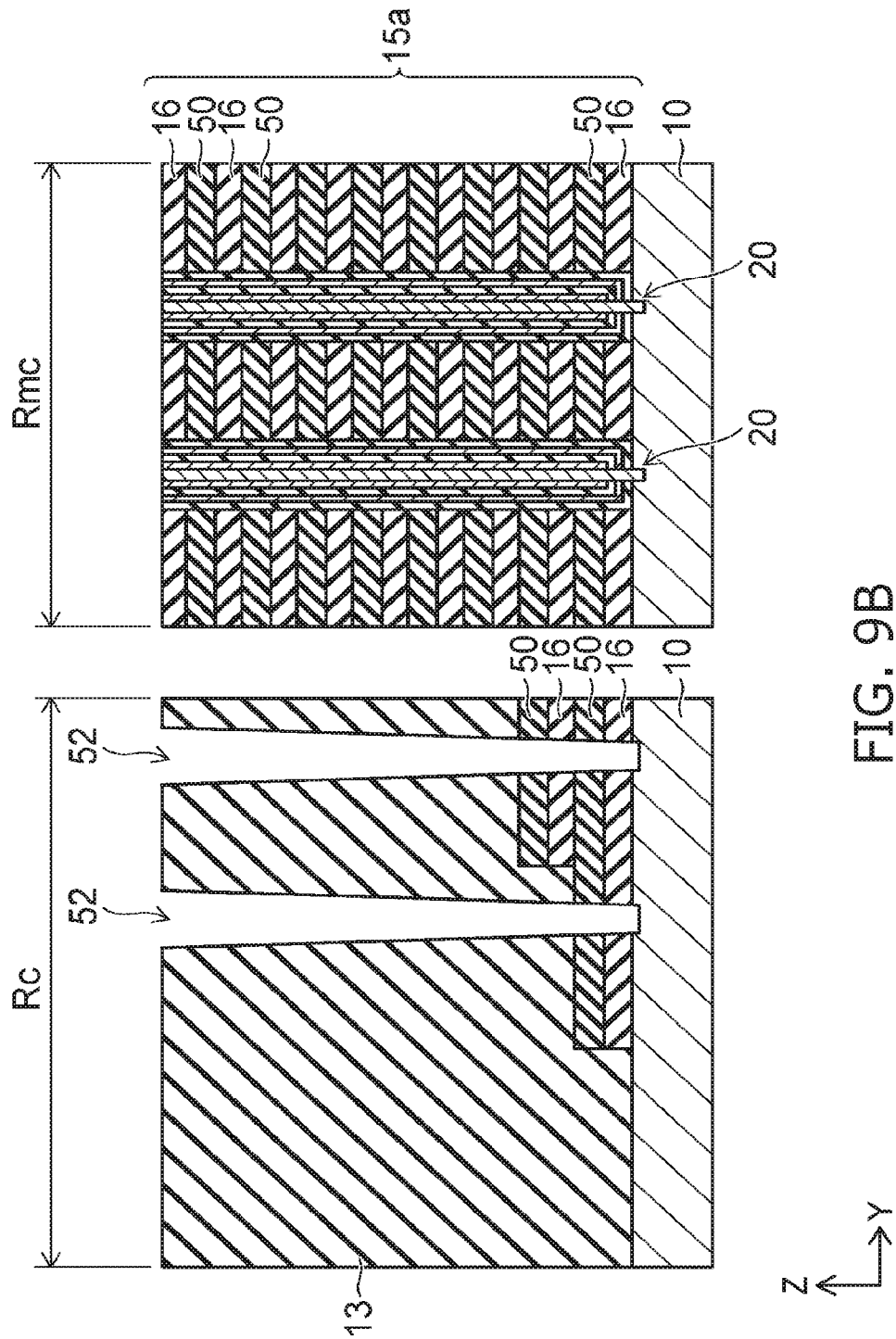

As illustrated in FIGS. 9A and 9B, holes 52 are formed in the contact region Rc using RIE, for example. The holes 52 extend in the Z-direction through the insulating film 13 and the stacked body 15a. Moreover, the holes 52 partially extend into the silicon substrate 10.

Figure 10A:
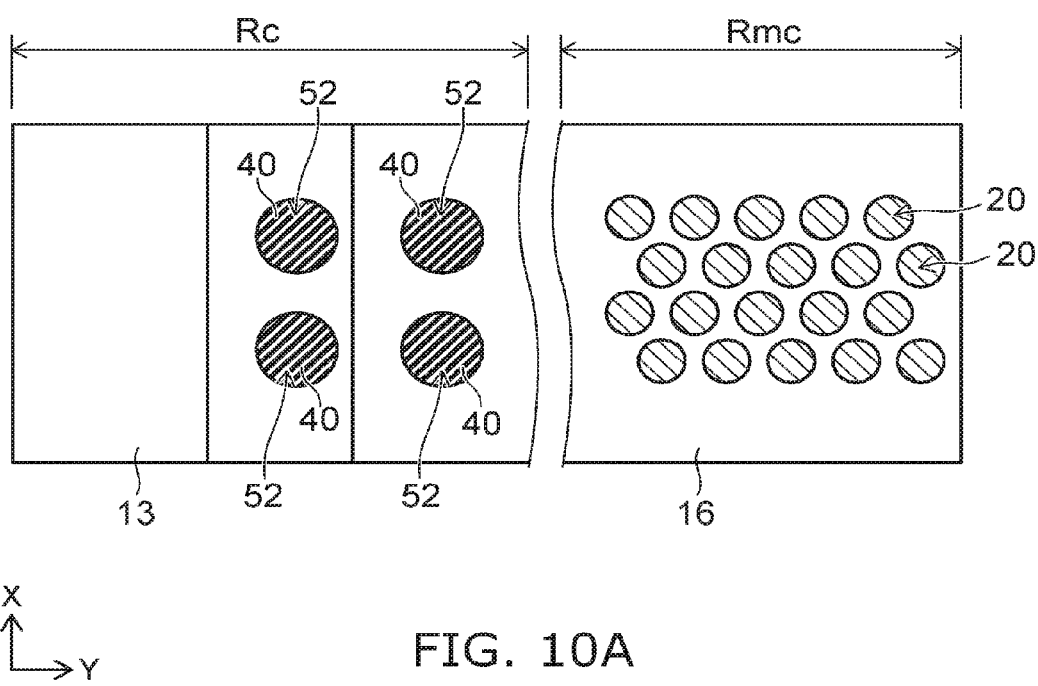
Figure 10B:
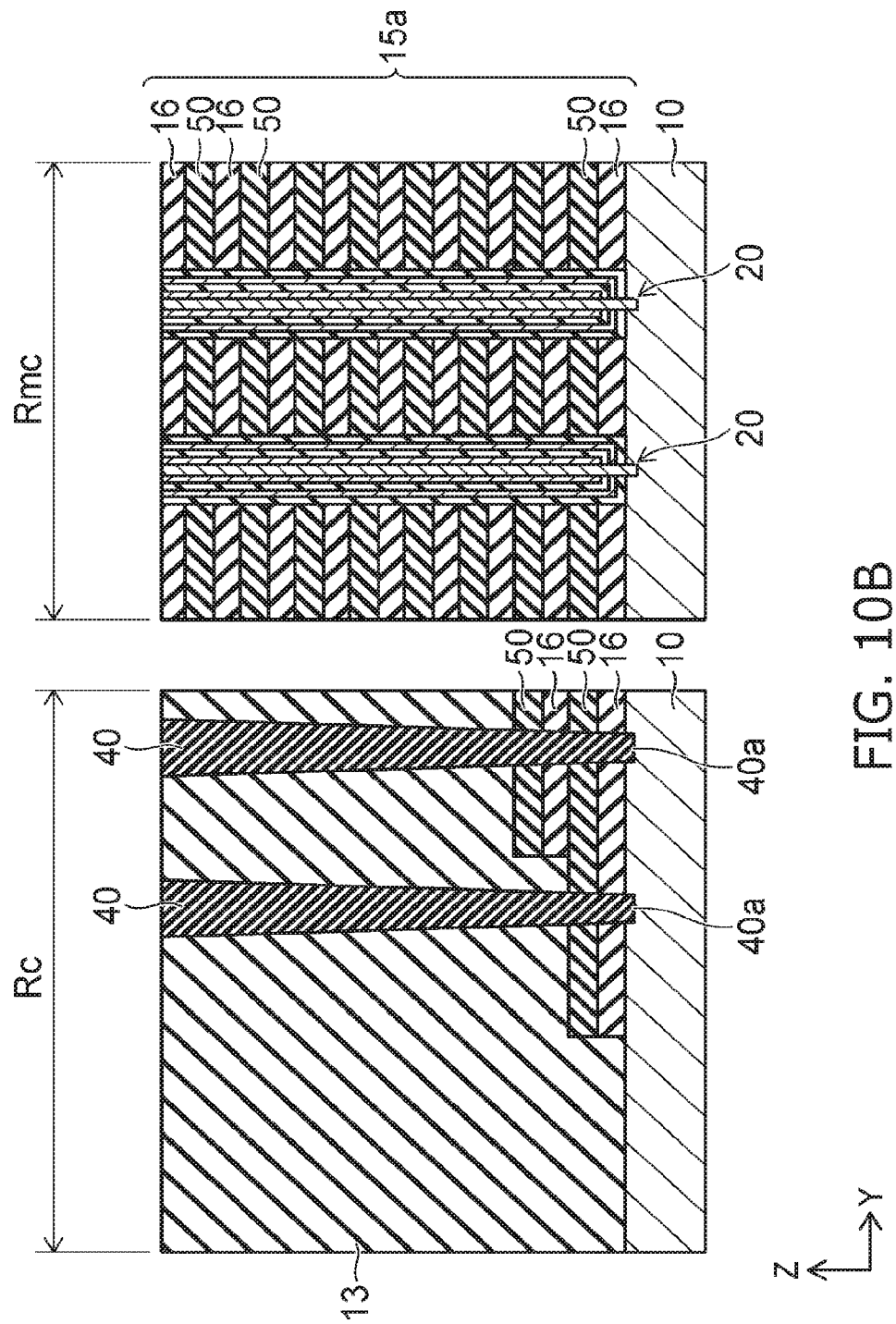

As illustrated in FIGS. 10A and 10B, silicon oxide is deposited inside the holes 52 using a method such as CVD in order to form the columnar members 40. The lower portion 40a of each columnar member 40 is embedded in the silicon substrate 10.

Figure 11A:
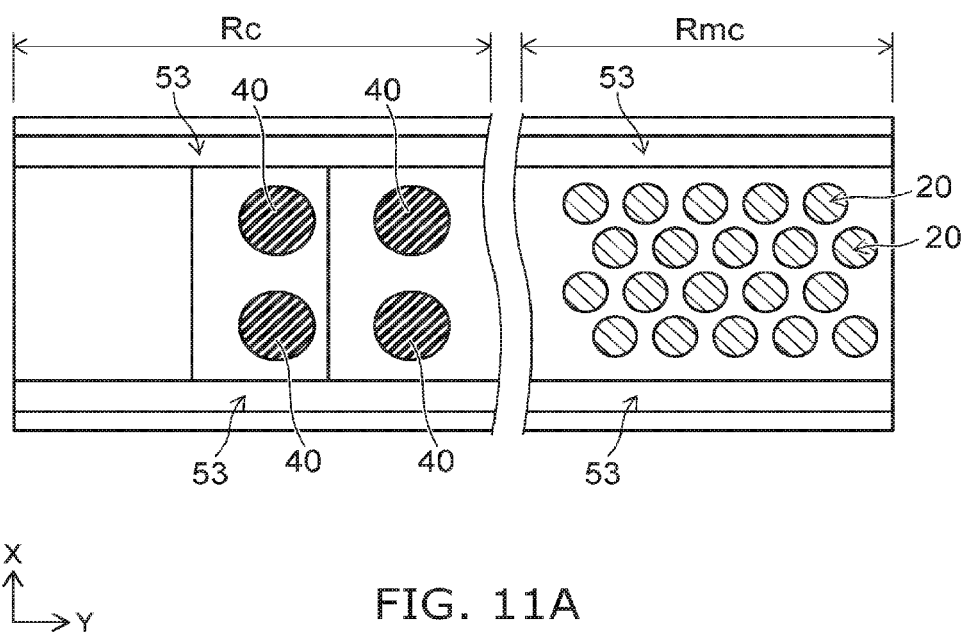
Figure 11B:
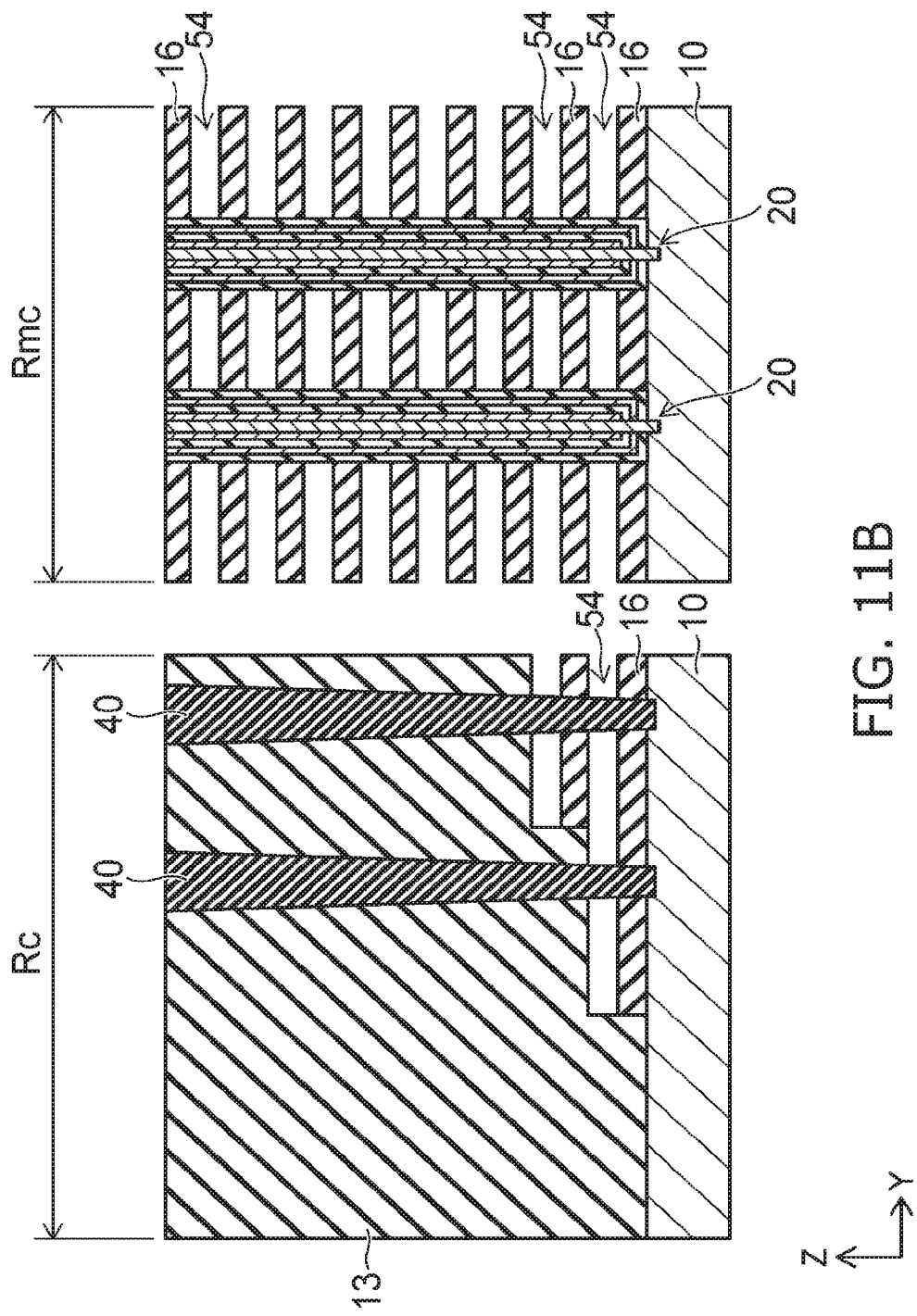

As illustrated in FIGS. 11A and 11B, a plurality of slits 53 extending in the Y-direction is formed in the stacked body 15a using an anisotropic etching process such as RIE. Slits that extend in the X-direction (not illustrated in the figures) are also formed at this time. The slits 53 go through the entire stacked body 15a. In this way, the slits 53 divide the stacked body 15a into a plurality of stacked bodies 15a that each extends in the Y-direction. Next, a wet etching process is performed through the slits 53 to remove the sacrificial films 50. When the sacrificial films 50 are formed from silicon nitride, for example, phosphoric acid may be used as the etchant, and the wet etching process may be performed using heated phosphoric acid. Removing the sacrificial films 50 through the slits 53 forms cavities 54.

Figure 12A:
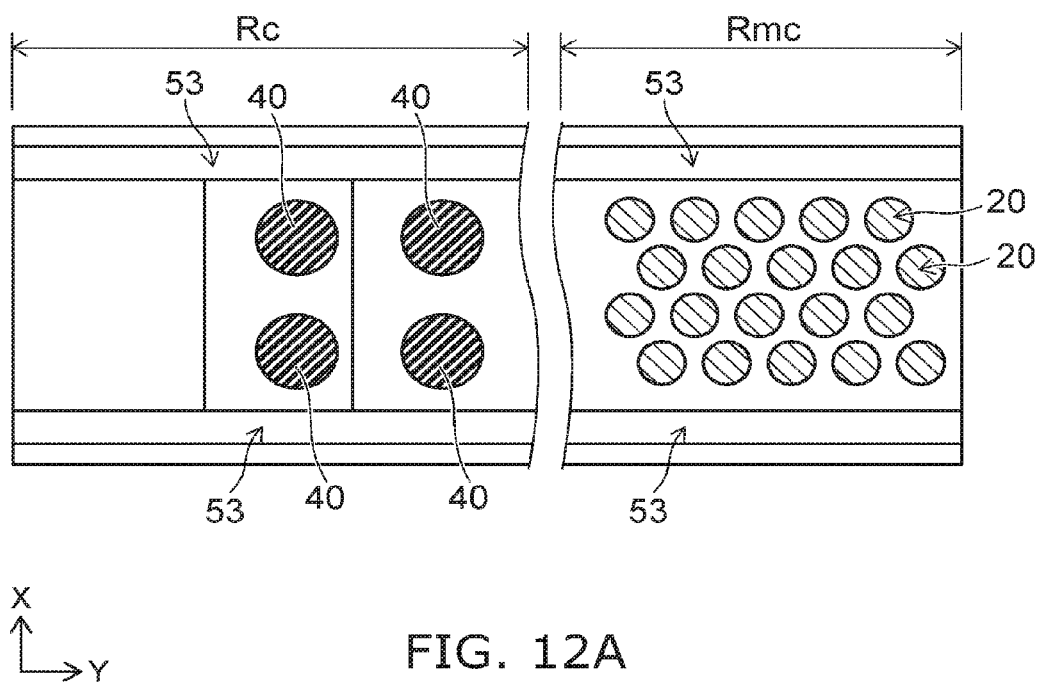
Figure 12B:
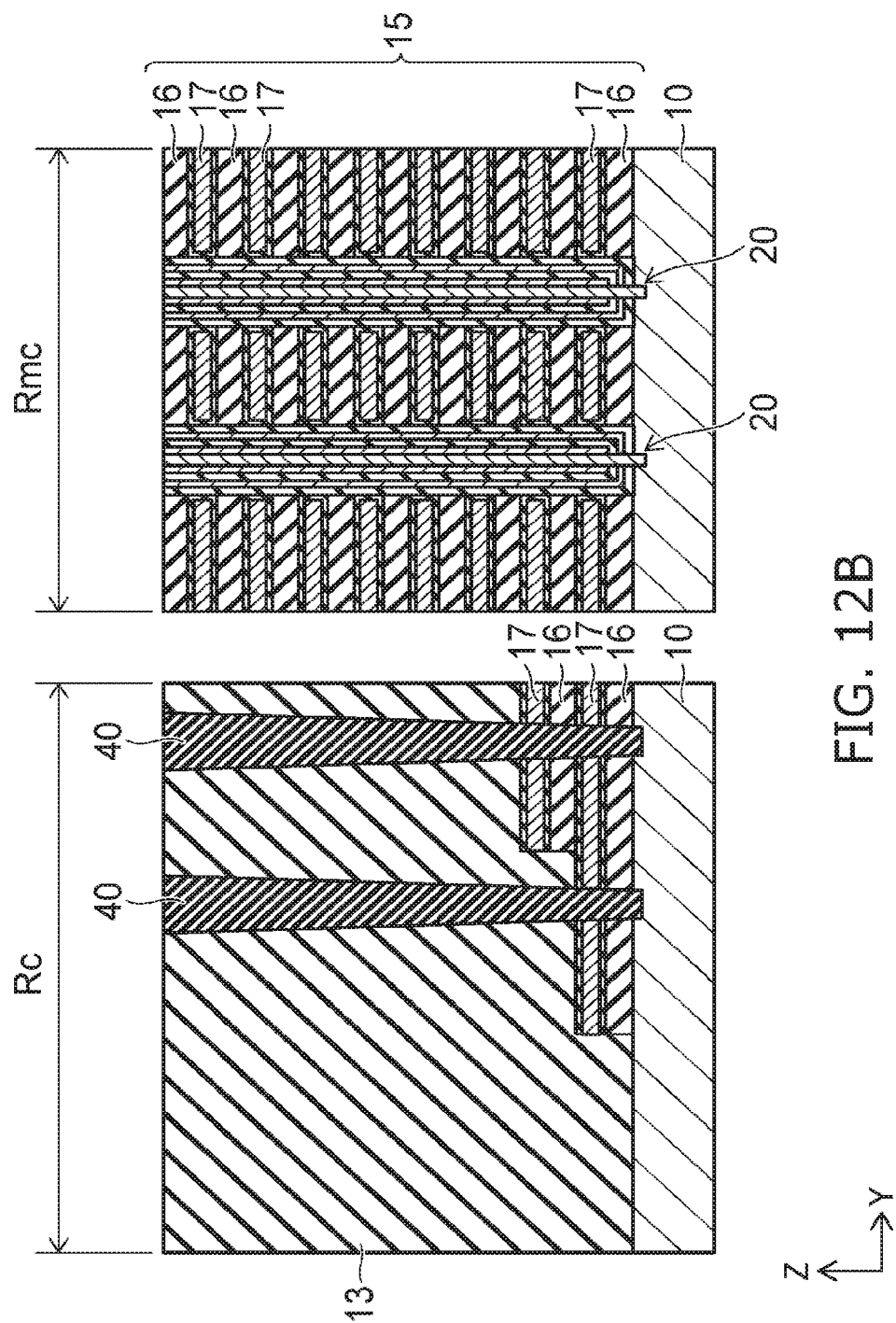

As illustrated in FIGS. 12A and 12B, conductive films made from a material such as tungsten or molybdenum are deposited through the slits 53 in order to fill in the cavities 54. In this way, the electrode films 17 are formed. Replacing the sacrificial films 50 with the electrode films 17 completes formation of the stacked bodies 15 between the slits 53.

Figure 13A:
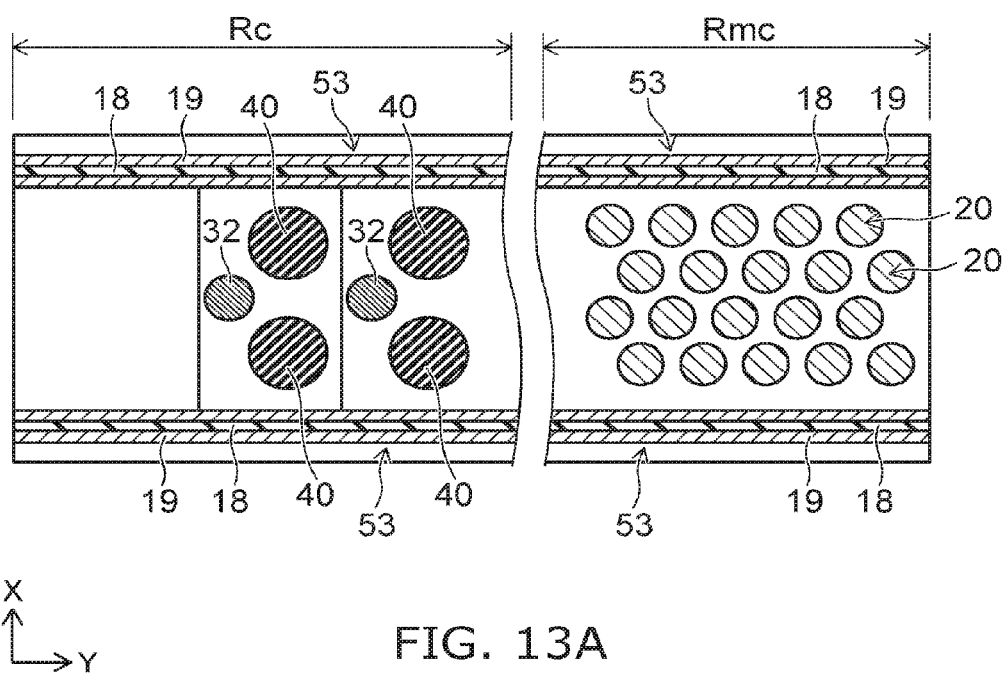
Figure 13B:
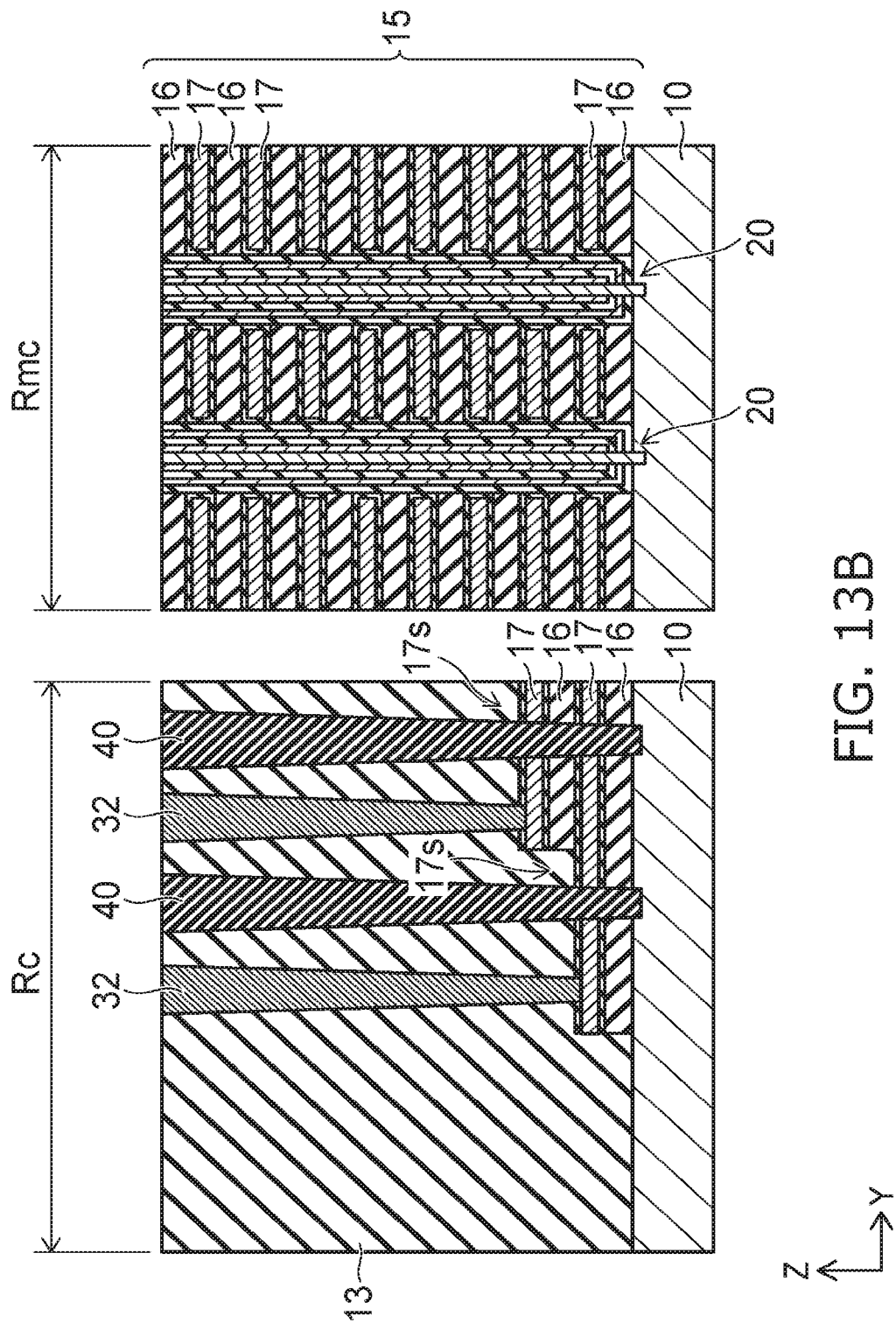

As illustrated in FIGS. 13A and 13B, a layer of silicon oxide is deposited over the entire surface to form an insulating film, and then this insulating film is etched, leaving the insulating film remaining on the sidewalls of the slits 53 in order to form the insulating films 19. Next, thick layers of tungsten or molybdenum are deposited to form conductive films. In this way, the source electrodes 18 are formed inside the slits 53. Then, in the contact region Rc, the insulating film 12 (not illustrated in the figures) is formed on top of the insulating film 13, and contact holes are formed in a region directly above the steps 17s of the electrode films 17. Next, the contact holes are filled with a conductive material such as tungsten in order to form the contacts 32 inside the contact holes.

This completes the manufacture of the semiconductor memory device 1 according to the first embodiment.

Next, the effects of the first embodiment will be described.

In the first embodiment, the lower portion 40a of each columnar member 40 is embedded in the silicon substrate 10. Providing the columnar members 40 in this way makes it possible to suppress the stacked bodies 15a from warping and causing the electrode films 17 to deform when removing the sacrificial films 50 through the slits 53 to form the cavities 54 in order to replace the sacrificial films 50 with the electrode films 17. In this way, a uniform shape can be maintained for each of the electrode films 17 from the upper layers to the lower layers, thereby substantially eliminating differences in the resistance of each electrode film 17. This, in turn, makes it possible to prevent issues due to differences in the memory operating characteristics of each memory cell due to differences in the electrode films 17.

Second Embodiment

Figure 14:
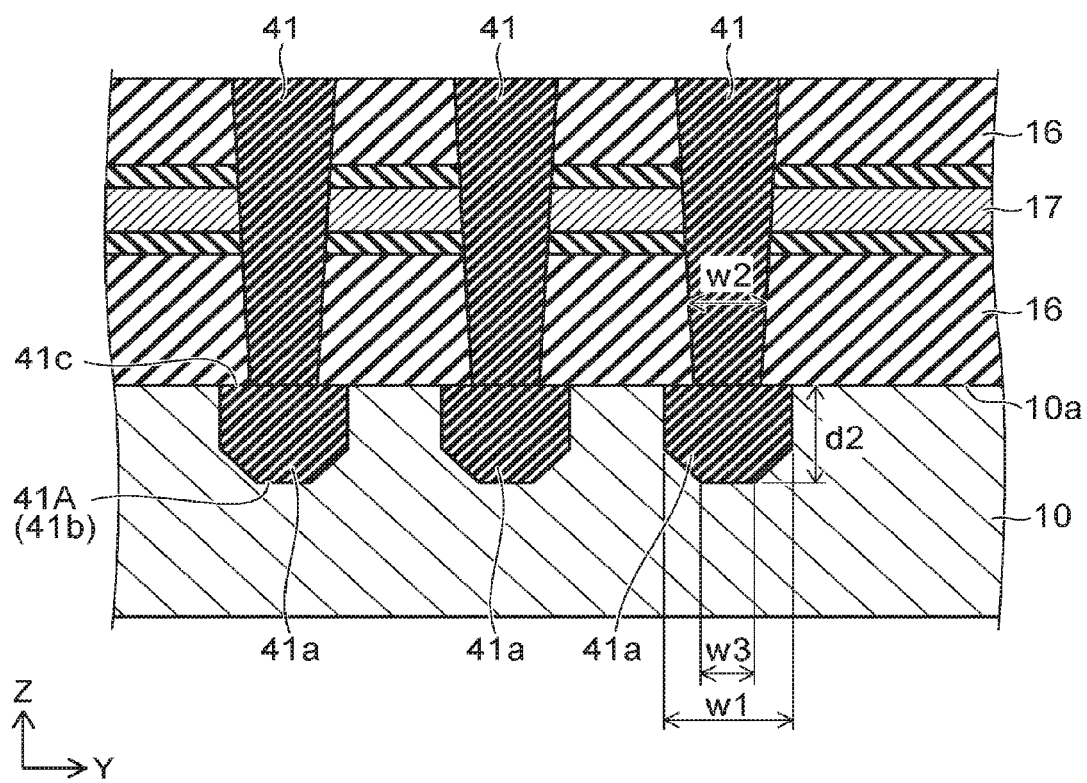
FIG. 14 is a partial cross-sectional view of a semiconductor memory device according to a second embodiment.

FIG. 14 is a partial cross-sectional view of a semiconductor memory device according to a second embodiment.

Figure 15:
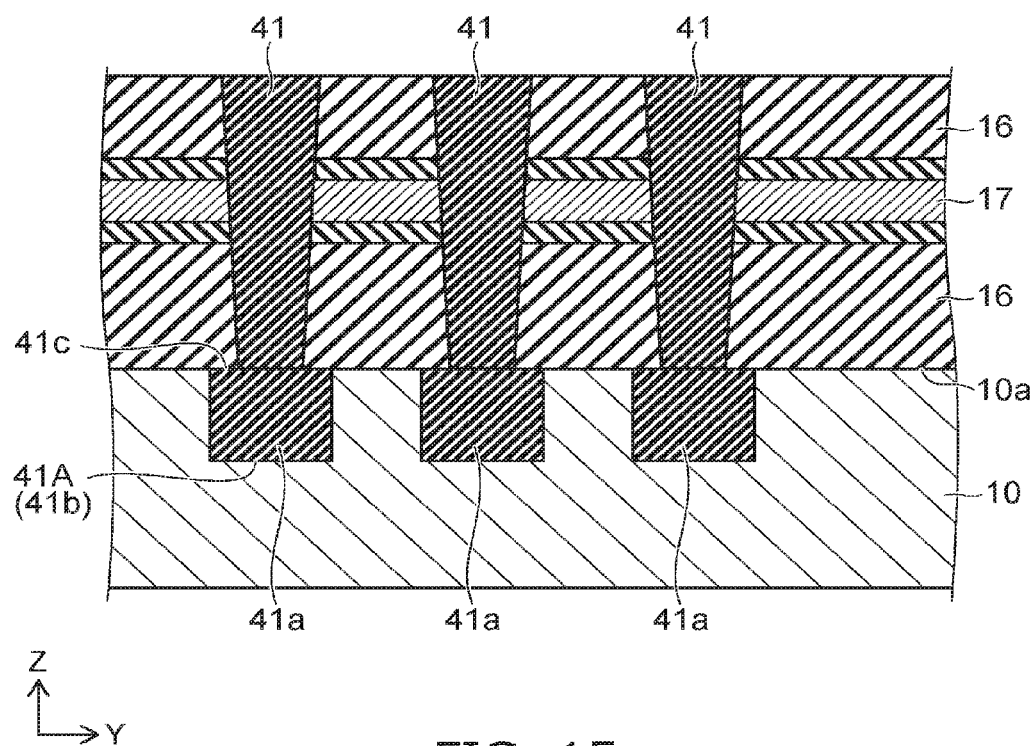
FIG. 15 is a partial cross-sectional view of a semiconductor memory device according to a variation of the second embodiment.

FIG. 15 is a partial cross-sectional view of a semiconductor memory device according to a variation of the second embodiment.

Figure 16:
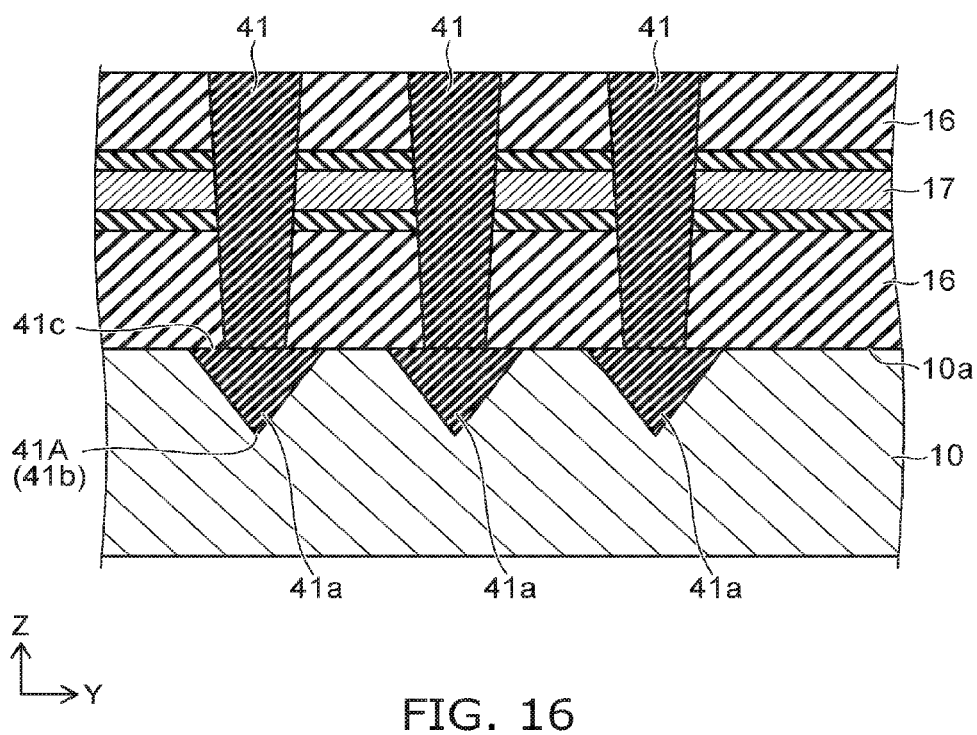
FIG. 16 is a partial cross-sectional view of a semiconductor memory device according to a variation of the second embodiment.

FIG. 16 is a partial cross-sectional view of a semiconductor memory device according to a variation of the second embodiment.

Figure 17:
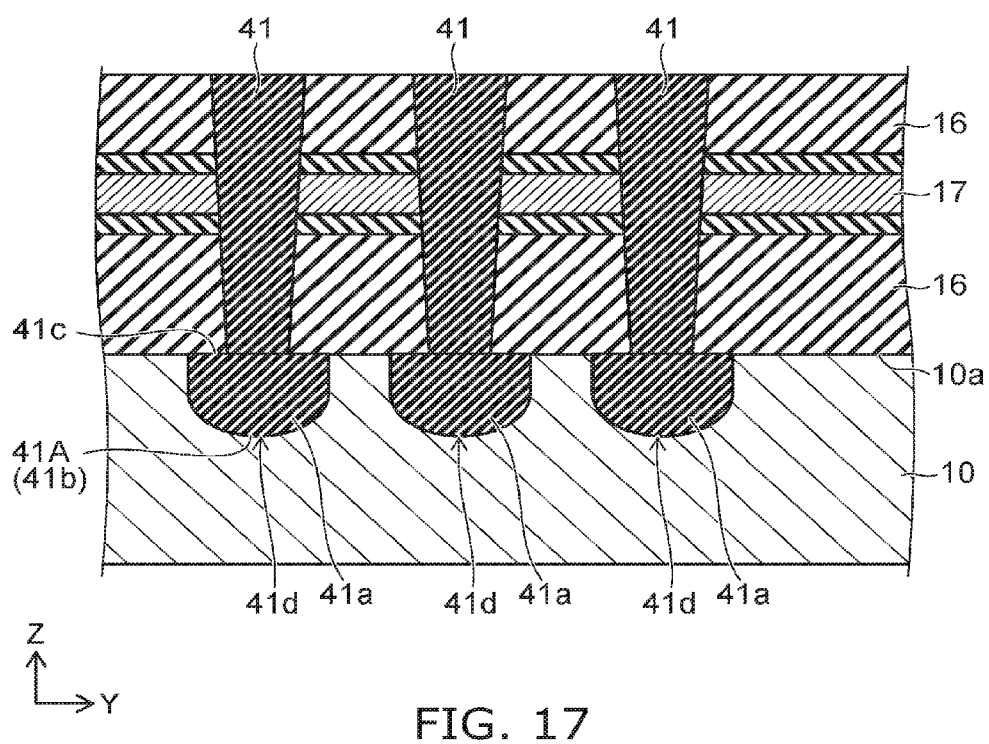
FIG. 17 is a partial cross-sectional view of a semiconductor memory device according to a variation of the second embodiment.

FIG. 17 is a partial cross-sectional view of a semiconductor memory device according to a variation of the second embodiment.

In the second embodiment, the shape of the columnar members is different than in the first embodiment. The aspects of the configuration of the second embodiment other than the shape of the columnar members are the same as in the first embodiment, and therefore a detailed description of those other aspects will be omitted here.

FIGS. 14 to 17 correspond to the same view illustrated in FIG. 4 and illustrate how the lower portion 41a of each columnar member 41 is embedded in the silicon substrate 10.

As illustrated in FIG. 14, the lower portions 41a of the columnar members 41 have a polygonal shape when viewed in a Y-Z cross-sectional view of a cross section taken in the Z-direction of the silicon substrate 10 and the stacked body 15. The lower portions 41a each have a hexagonal shape when viewed in a Y-Z cross-sectional view, for example. The lower portions 41a may also have a quadrilateral shape as illustrated in FIG. 15 or a triangular shape as illustrated in FIG. 16 when viewed in a Y-Z cross-sectional view. Alternatively, as illustrated in FIG. 17, each lower portion 41a may include a curved section 41d (the outer edge, for example) when viewed in a Y-Z cross-sectional view.

The bottom end 41b of each lower portion 41a is positioned at a depth d2 beneath the top surface 10a of the silicon substrate 10, for example. The depth d2 is greater than or equal to 10 nm, for example.

The top end 41c of each lower portion 41a is provided near the boundary between the silicon substrate 10 and the insulating film 16, for example. The top ends 41c contact the insulating film 16, for example. The top ends 41c may also be provided in the silicon substrate 10.

The width W1 in the Y-direction of each top end 41c is greater than the width W2 in the Y-direction of the portion of each columnar member 41 positioned within the insulating film 16 provided on top of the silicon substrate 10. In other words, the diameter of each top end 41c is greater than the diameter of the portion of each columnar member 41 positioned within the insulating film 16. Here, the diameter of each lower portion 41a corresponds to the width W1 in the Y-direction of each top end 41c, that is, to the diameter of each top end 41c. Moreover, when the lower portions 41a are shaped as illustrated in FIGS. 15 to 17, the diameter of each lower portion 41a corresponds to the width of each top end 41c in the Y-direction.

Furthermore, the width W1 in the Y-direction of each top end 41c may be greater than the width W3 in the Y-direction of the bottom end 41A (that is, the bottom end 41b of each lower portion 41a) of each columnar member 41. In other words, the diameter of each top end 41c may be greater than the diameter of each bottom end 41b.

Next, a method for manufacturing the semiconductor memory device according to this embodiment will be described.

Figure 18:
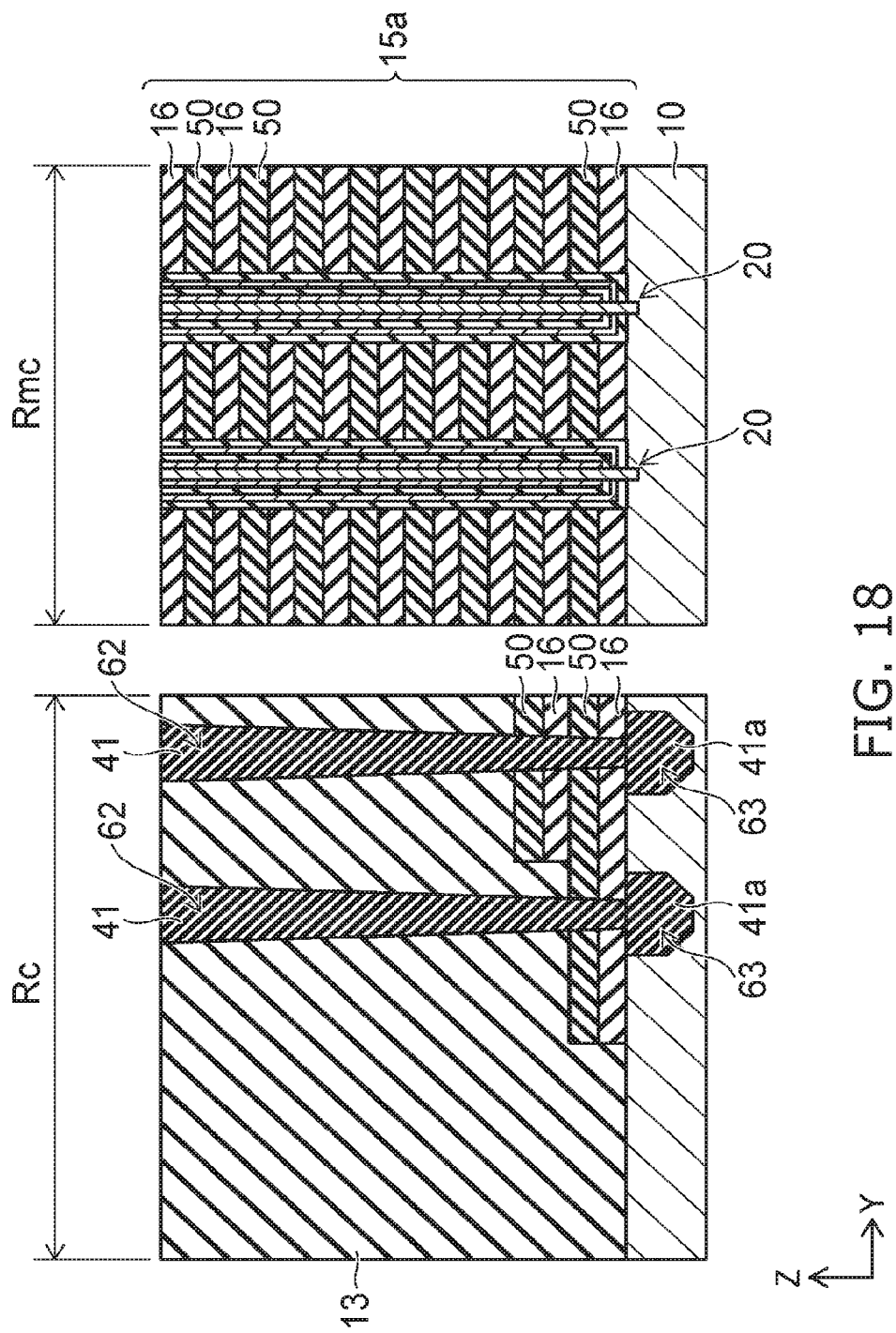
FIG. 18 illustrates a method for manufacturing the semiconductor memory device according to the second embodiment.

FIG. 18 illustrates a method for manufacturing the semiconductor memory device according to the second embodiment.

In the method for manufacturing the semiconductor memory device of the second embodiment, the process for forming the columnar members is different than in the method for manufacturing the semiconductor memory device of the first embodiment. Therefore, the processes illustrated in FIGS. 5A and 5B to FIGS. 9A and 9B as well as the processes illustrated in FIGS. 11A and 11B to FIGS. 13A and 13B are the same in both the first embodiment and the second embodiment, and drawings and descriptions of those processes will be omitted here.

FIG. 18 is a cross-sectional view illustrating a method for manufacturing the semiconductor memory device. The cross-sectional view in FIG. 18 is an enlarged view of the cross section of the memory cell region Rmc and the contact region Rc illustrated in FIG. 2. Moreover, FIG. 18 illustrates the parts below the interlayer insulating film 14 in the memory cell region Rmc and the parts below the insulating film 12 in the contact region Rc.

First, as illustrated in FIG. 18, holes 62 are formed in the contact region Rc using RIE, for example. The holes 62 extend in the Z-direction through the insulating film 13 and the stacked body 15a and reach the top surface 10a of the silicon substrate 10.

Next, the silicon substrate 10 is etched to form holes 63. The silicon substrate 10 is dry-etched to form the holes 63, for example. For example, the silicon substrate 10 is etched using an alkaline solution or the like to form the holes 63 so that sufficient etching selectivity can be achieved with respect to the silicon nitride and silicon oxide. The holes 63 extend in the X- and Y-directions, with each hole 63 connected to one of the holes 62. The holes 63 each have a polygonal shape when viewed in a Y-Z cross-section, for example.

Next, silicon oxide is deposited inside the holes 62 and the holes 63 using a method such as CVD in order to form the columnar members 41. The lower portion 41a of each columnar member 41 is embedded in the silicon substrate 10.

Next, the effects of the second embodiment will be described.

In the second embodiment, the lower portions 41a that each have a greater diameter than the other portions of the columnar members 41 are embedded in the silicon substrate 10. Providing the columnar members 41 in this way makes it possible for the lower portions 41a to suppress the stacked bodies 15a from warping and causing the electrode films 17 to deform when removing the sacrificial films 50 through the slits 53 to form the cavities 54 in order to replace the sacrificial films 50 with the electrode films 17. In this way, a uniform shape can be maintained for each of the electrode films 17 from the upper layers to the lower layers, thereby substantially eliminating differences in the resistance of each electrode film 17. This, in turn, makes it possible to prevent issues due to differences in the memory operating characteristics of each memory cell due to differences in the electrode films 17.

Furthermore, these lower portions 41a increase the contact area between the columnar members 41 and the silicon substrate 10 and also increase the contact area between the columnar members 41 and the insulating film 16 near the boundary between the silicon substrate 10 and the insulating film 16. This makes it possible to suppress the columnar members 41 from separating from the silicon substrate 10 when removing the sacrificial films 50 to form the cavities 54 due to stress created in the insulating film 16 after the sacrificial films 50 are removed, surface tension created when removing the sacrificial films 50, dissolution that occurs when removing the sacrificial films 50, or the like.

Third Embodiment

Figure 19:
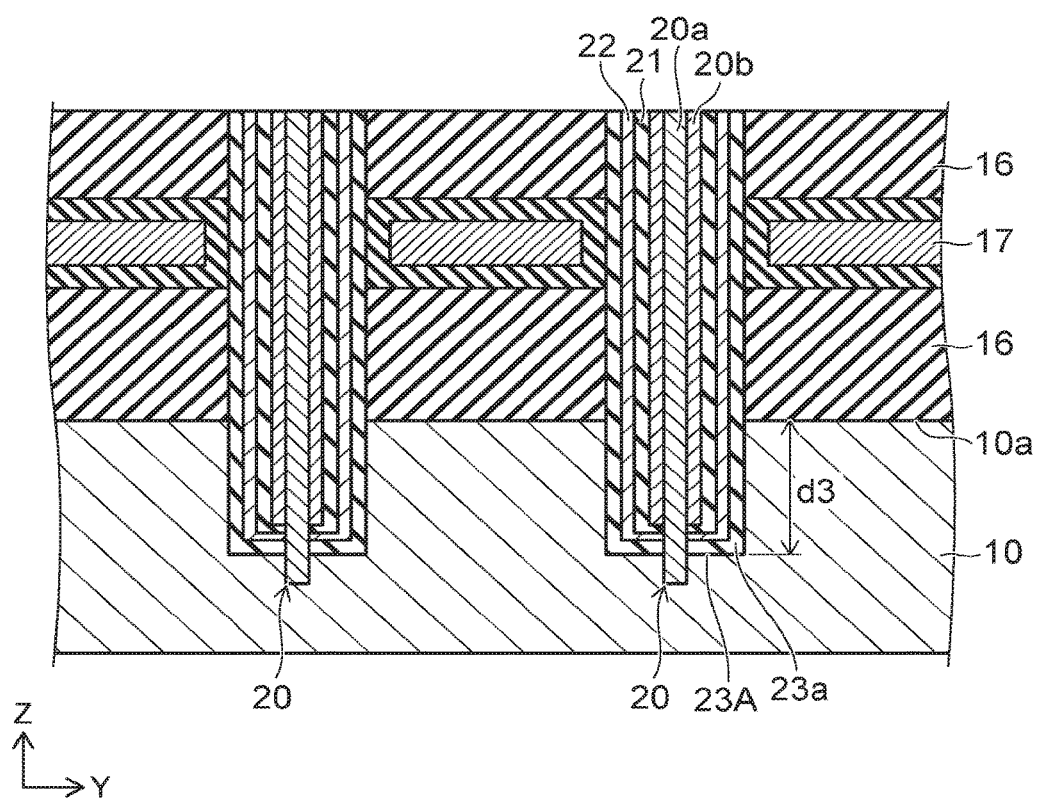
FIG. 19 is a partial cross-sectional view of a semiconductor memory device according to a third embodiment.

FIG. 19 is a partial cross-sectional view of a semiconductor memory device according to a third embodiment.

Figure 20:
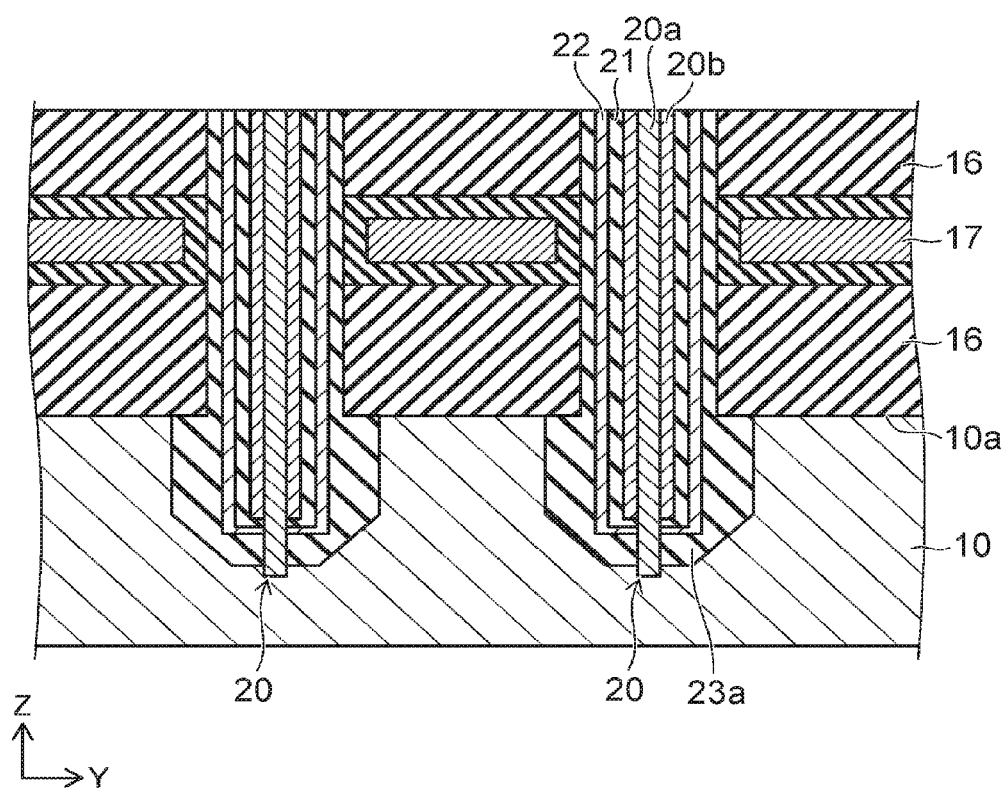
FIG. 20 is a partial cross-sectional view of a semiconductor memory device according to a variation of the third embodiment.

FIG. 20 is a partial cross-sectional view of a semiconductor memory device according to a variation of the third embodiment.

In the third embodiment, the portions of the silicon pillars 20 that contact the silicon substrate 10 are different than in the first embodiment. The other aspects of the configuration of the third embodiment are the same as in the first embodiment, and therefore a detailed description of those other aspects will be omitted here.

As illustrated in FIG. 19, a portion of each silicon pillar 20 is embedded in the silicon substrate 10. A section of each core portion 20a and a section of each cover layer 20b are embedded in the silicon substrate 10, with the core portion 20a in direct contact with the silicon substrate 10. Moreover, a portion of each tunnel insulating film 21, a portion of each charge storage film 22, and a portion of each block insulating film 23 (a portion of each silicon oxide layer 23a) are also embedded in the silicon substrate 10. In other words, the lower portion of each silicon pillar 20, the lower portion of each charge storage film 22, and the lower portion of each block insulating film 23 are embedded in the silicon substrate 10.

The bottom end 23A of each silicon oxide layer 23a is positioned at a depth d3 beneath the top surface 10a of the silicon substrate 10, for example. The depth d3 is greater than or equal to 10 nm, for example.

As illustrated in FIG. 20, the portion of each silicon oxide layer 23a embedded in the silicon substrate 10 may have a polygonal shape when viewed in a Y-Z cross-section.

Next, the effects of the third embodiment will be described.

In the third embodiment, the lower portion of each silicon pillar 20, the lower portion of each charge storage film 22, and the lower portion of each block insulating film 23 are embedded in the silicon substrate 10. This configuration makes it possible to suppress the stacked bodies 15a from warping and causing the electrode films 17 to deform when removing the sacrificial films 50 through the slits 53 to form the cavities 54 in order to replace the sacrificial films 50 with the electrode films 17. Therefore, a uniform shape can be maintained for each of the electrode films 17 from the upper layers to the lower layers, thereby substantially eliminating differences in the resistance of each electrode film 17. This, in turn, makes it possible to prevent issues due to differences in the memory operating characteristics of each memory cell due to differences in the electrode films 17.

Furthermore, providing the portions of silicon oxide layers 23a embedded in the silicon substrate 10 to have a polygonal shape increases the contact area between the silicon oxide layers 23a and the silicon substrate 10 and also increases the contact area between the silicon oxide layers 23a and the insulating film 16 near the boundary between the silicon substrate 10 and the insulating film 16. This makes it possible to suppress the silicon pillars 20 and the charge storage films 22 from separating from the silicon substrate 10 when removing the sacrificial films 50 to form the cavities 54 due to stress created in the insulating film 16 after the sacrificial films 50 are removed, surface tension created when removing the sacrificial films 50, or dissolution that occurs when removing the sacrificial films 50, or the like.

Fourth Embodiment

Figure 21:
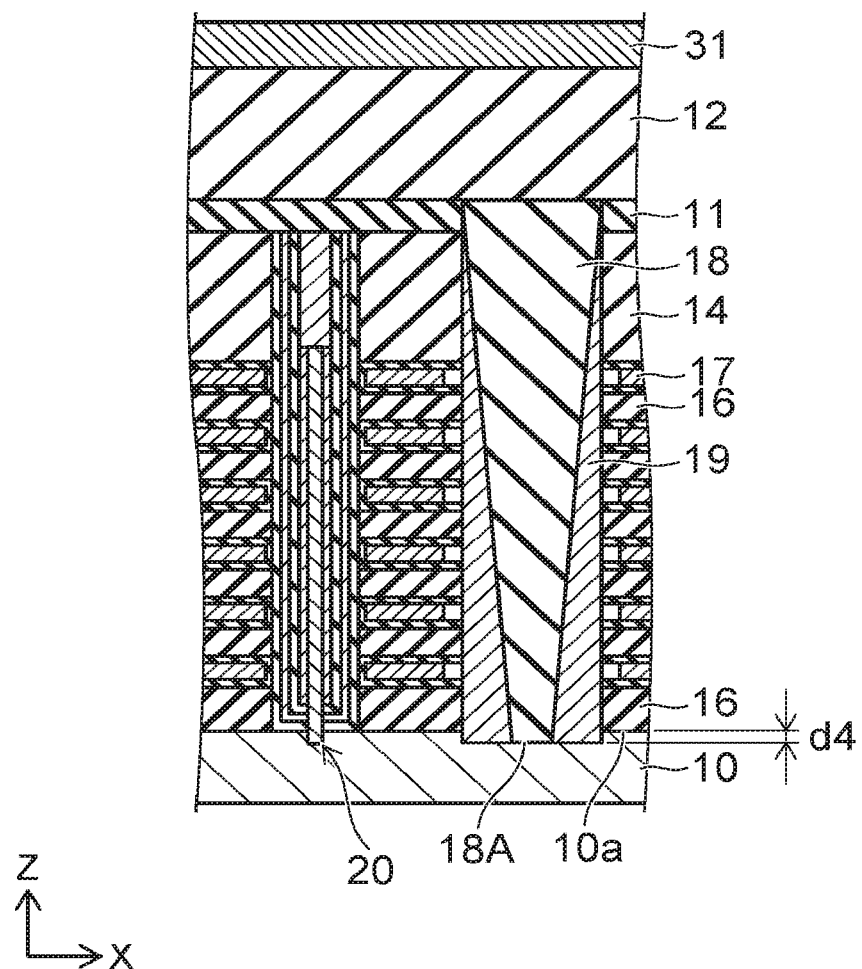
FIG. 21 is a partial cross-sectional view of a semiconductor memory device according to a fourth embodiment.

FIG. 21 is a partial cross-sectional view of a semiconductor memory device according to a fourth embodiment.

In the fourth embodiment, the portions of the source electrodes 18 that contact the silicon substrate 10 are different than in the first embodiment. The other aspects of the configuration of the fourth embodiment are the same as in the first embodiment, and therefore a detailed description of those other aspects will be omitted here.

As illustrated in FIG. 21, a portion of each source electrode 18 is embedded in the silicon substrate 10. The source electrodes 18 contact the silicon substrate 10. Furthermore, a portion of each insulating film 19 is also embedded in the silicon substrate 10. In other words, the lower portion of each source electrode 18 and the lower portion of each insulating film 19 are embedded in the silicon substrate 10.

The bottom end 18A of each source electrode 18 is positioned at a depth d4 beneath the top surface 10a of the silicon substrate 10, for example. The depth d4 is greater than or equal to 10 nm, for example.

Next, the effects of the fourth embodiment will be described.

In the fourth embodiment, the lower portion of each source electrode 18 and the lower portion of each insulating film 19 are embedded in the silicon substrate 10. Providing the source electrodes 18 and the insulating films 19 in this way makes it possible to suppress the stacked bodies 15a from warping and causing the electrode films 17 to deform when removing the sacrificial films 50 through the slits 53 to form the cavities 54 in order to replace the sacrificial films 50 with the electrode films 17. In this way, a uniform shape can be maintained for each of the electrode films 17 from the upper layers to the lower layers, thereby substantially eliminating differences in the resistance of each electrode film 17. This, in turn, makes it possible to prevent issues due to differences in the memory operating characteristics of each memory cell due to differences in the electrode films 17.

Fifth Embodiment

Figure 22:
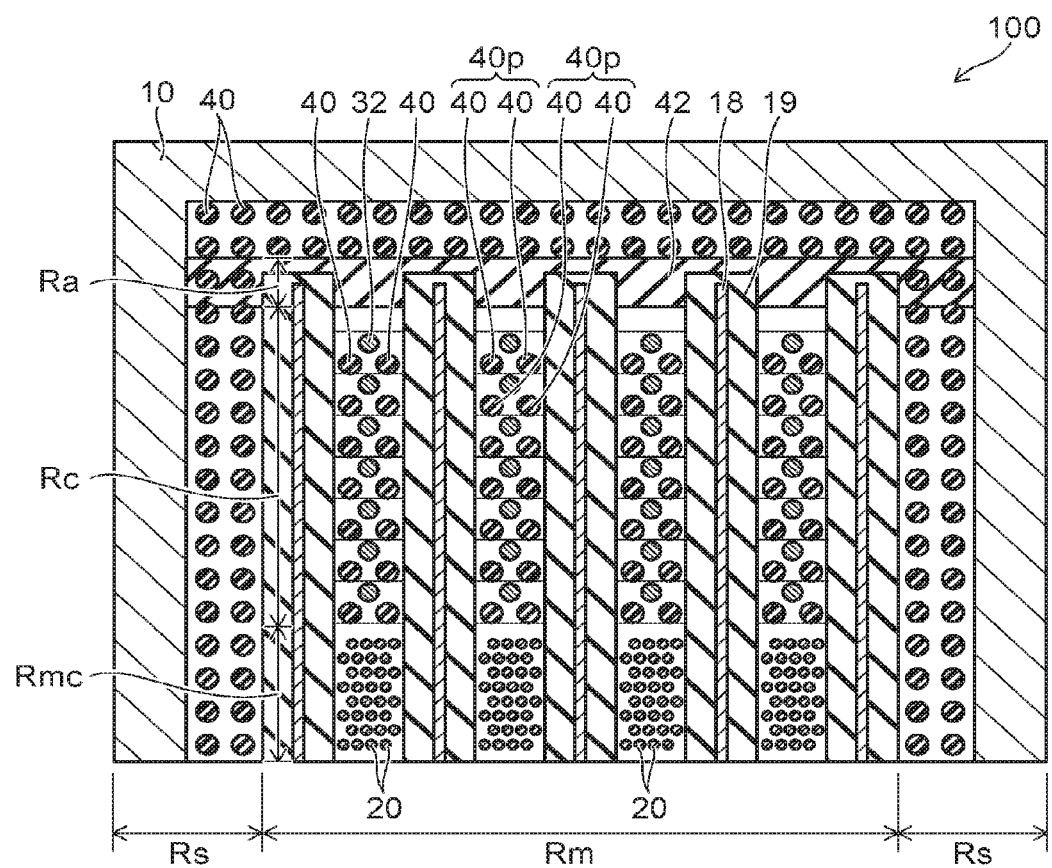
FIG. 22 is a schematic plan view of a semiconductor memory device according to a fifth embodiment.

FIG. 22 is a schematic plan view of a semiconductor memory device according to a fifth embodiment.

Figure 23:
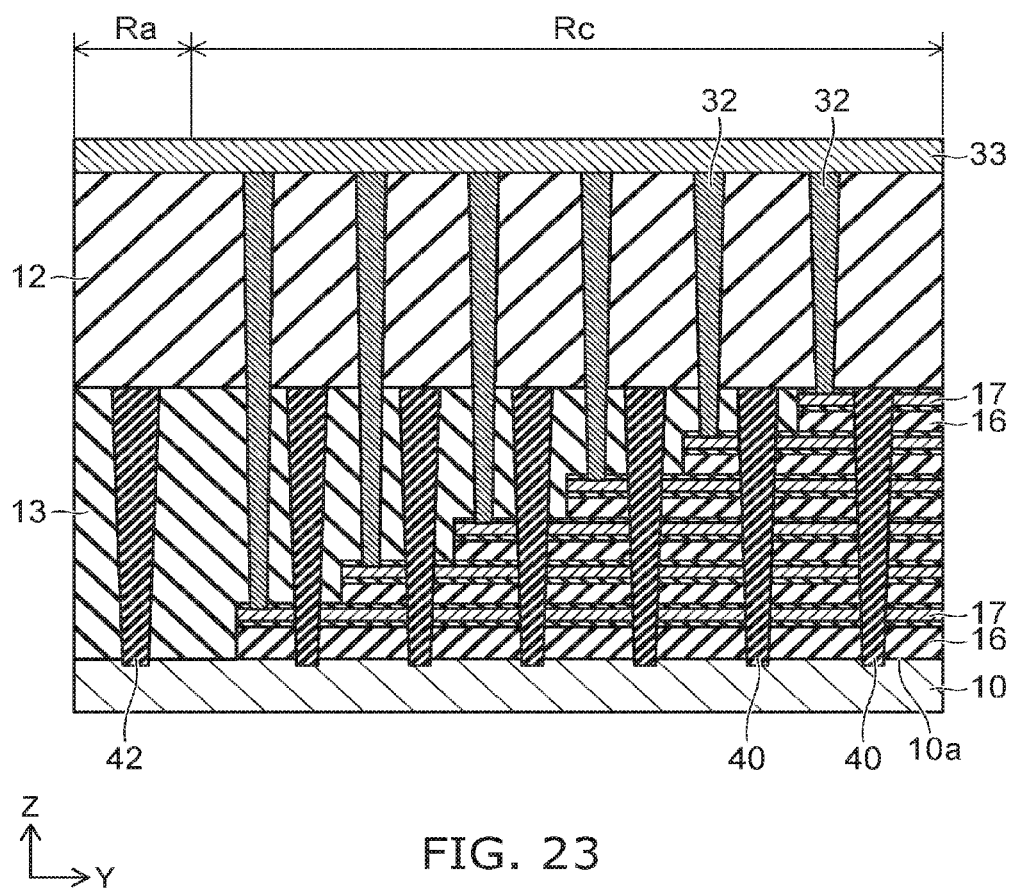
FIG. 23 is a schematic cross-sectional view of the semiconductor memory device according to the fifth embodiment.

FIG. 23 is a schematic cross-sectional view of the semiconductor memory device according to the fifth embodiment.

Figure 24:
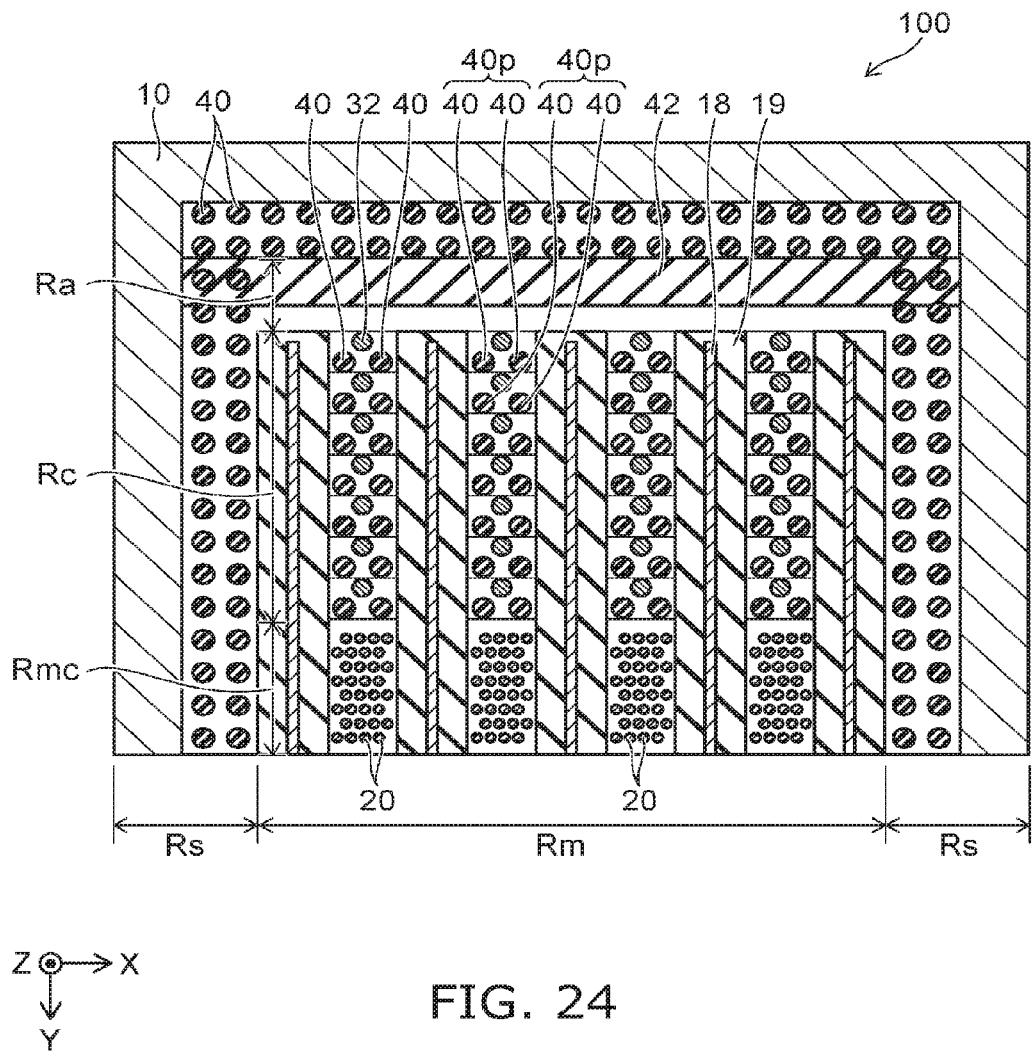
FIG. 24 is a schematic plan view of a semiconductor memory device according to a variation of the fifth embodiment.

FIG. 24 is a schematic plan view of a semiconductor memory device according to a variation of the fifth embodiment.

FIGS. 22 and 24 are plan views illustrating a semiconductor memory device 100. FIG. 23 is a Y-Z cross-sectional view illustrating a contact region Rc and a support region Ra in a memory region Rm of the semiconductor memory device 100.

The fifth embodiment is different from the first embodiment in that a plate-shaped member 42 is provided in the support region Ra. The aspects of the configuration of the fifth embodiment other than the plate-shaped member 42 are the same as in the first embodiment, and therefore a detailed description of those other aspects will be omitted here.

As illustrated in FIGS. 22 and 23, the semiconductor memory device 100 includes the plate-shaped member 42. The plate-shaped member 42 is provided in the memory region Rm and the peripheral region Rs. The memory region Rm includes the memory cell region Rmc, the contact region Rc, and the support region Ra. The memory cell region Rmc, the contact region Rc, and the support region Ra are arranged along the Y-direction. Moreover, the plate-shaped member 42 is provided in the support region Ra. The plate-shaped member 42 goes through the insulating film 13 in the Z-direction. A portion of the plate-shaped member 42 is embedded in the silicon substrate 10. Moreover, the insulating film 13 is not illustrated in FIG. 22, and, as illustrated in FIG. 23, the insulating film 13 is provided in the contact region Rc and the support region Ra. The plate-shaped member 42 is positioned in the support region Ra such that the plate-shaped member 42 is sandwiched by the insulating film 13 in the Y-direction.

The plate-shaped member 42 extends in the X-direction, and a portion of each source electrode 18 and a portion of each insulating film 19 that extend in the Y-direction are formed in the plate-shaped member 42. When the plate-shaped member 42 and the insulating films 19 are both formed from a film that contains silicon oxide, for example, these films that include silicon oxide intersect with one another and extend in the X-direction and the Y-direction. The plate-shaped member 42 and the insulating films 19 may also be formed from different materials. For example, the plate-shaped member 42 may contain silicon oxide, and the insulating films 19 may contain silicon nitride.

A portion of each source electrode 18 and a portion of each insulating film 19 do not necessarily have to be positioned within the plate-shaped member 42 that extends in the X-direction. As illustrated in FIG. 24, for example, the source electrodes 18 and the insulating films 19 may be formed not contacting the plate-shaped member 42 at all.

Next, a method for manufacturing the semiconductor memory device according to the fifth embodiment will be described.

FIGS. 25A and 25B to FIGS. 28A and 28B illustrate a method for manufacturing the semiconductor memory device according to the fifth embodiment.

The method for manufacturing the semiconductor memory device of the fifth embodiment includes a process for forming the plate-shaped member 42 in the support region Ra and is different in this regard than in the method for manufacturing the semiconductor memory device of the first embodiment. Therefore, the processes illustrated in FIGS. 5A and 5B to FIGS. 10A and 10B are the same in both the first embodiment and the fifth embodiment, and drawings and descriptions of those processes will be omitted here.

FIGS. 25A to 28A and FIGS. 25B to 28B are plan views and cross-sectional views, respectively, illustrating the method for manufacturing the semiconductor memory device. The plan views in FIGS. 25A to 28A are enlarged views of the plan view of the memory cell region Rmc, the contact region Rc, and the support region Ra illustrated in FIG. 22. The cross-sectional views in FIGS. 25B to 28B are enlarged views of the cross section of the memory cell region Rmc, the contact region Rc, and the support region Ra illustrated in FIG. 23. Moreover, FIGS. 25B to 28B illustrate the parts below the interlayer insulating film 14 in the memory cell region Rmc and the parts below the insulating film 12 in the contact region Rc and the support region Ra.

Figure 25A:
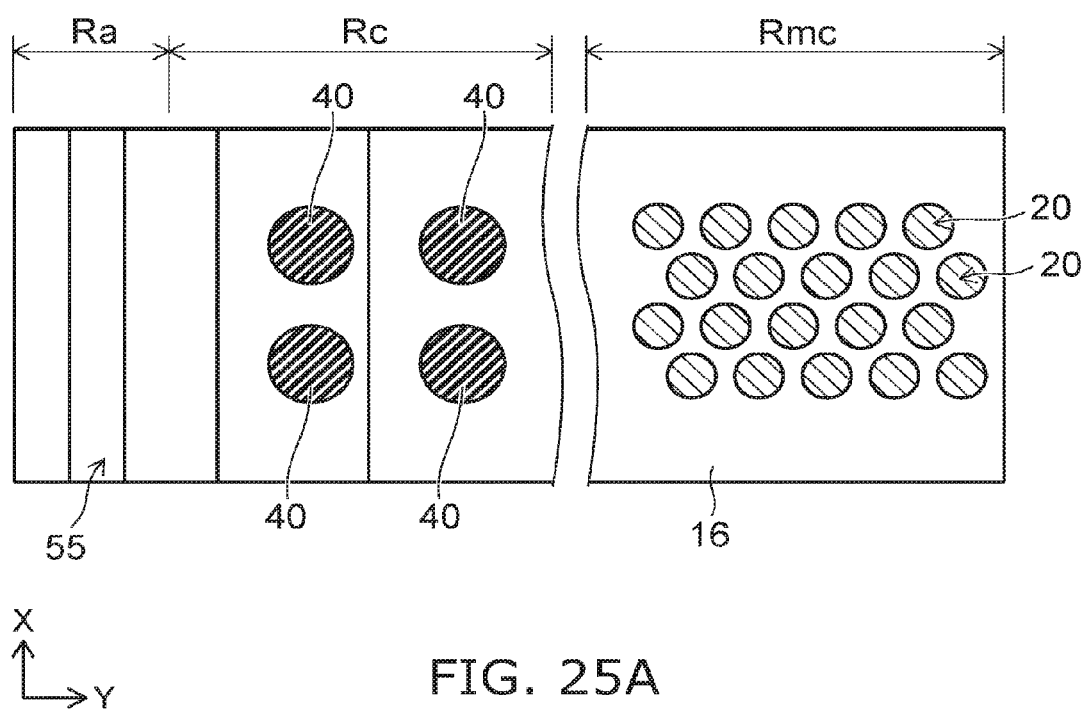
Figure 25B:
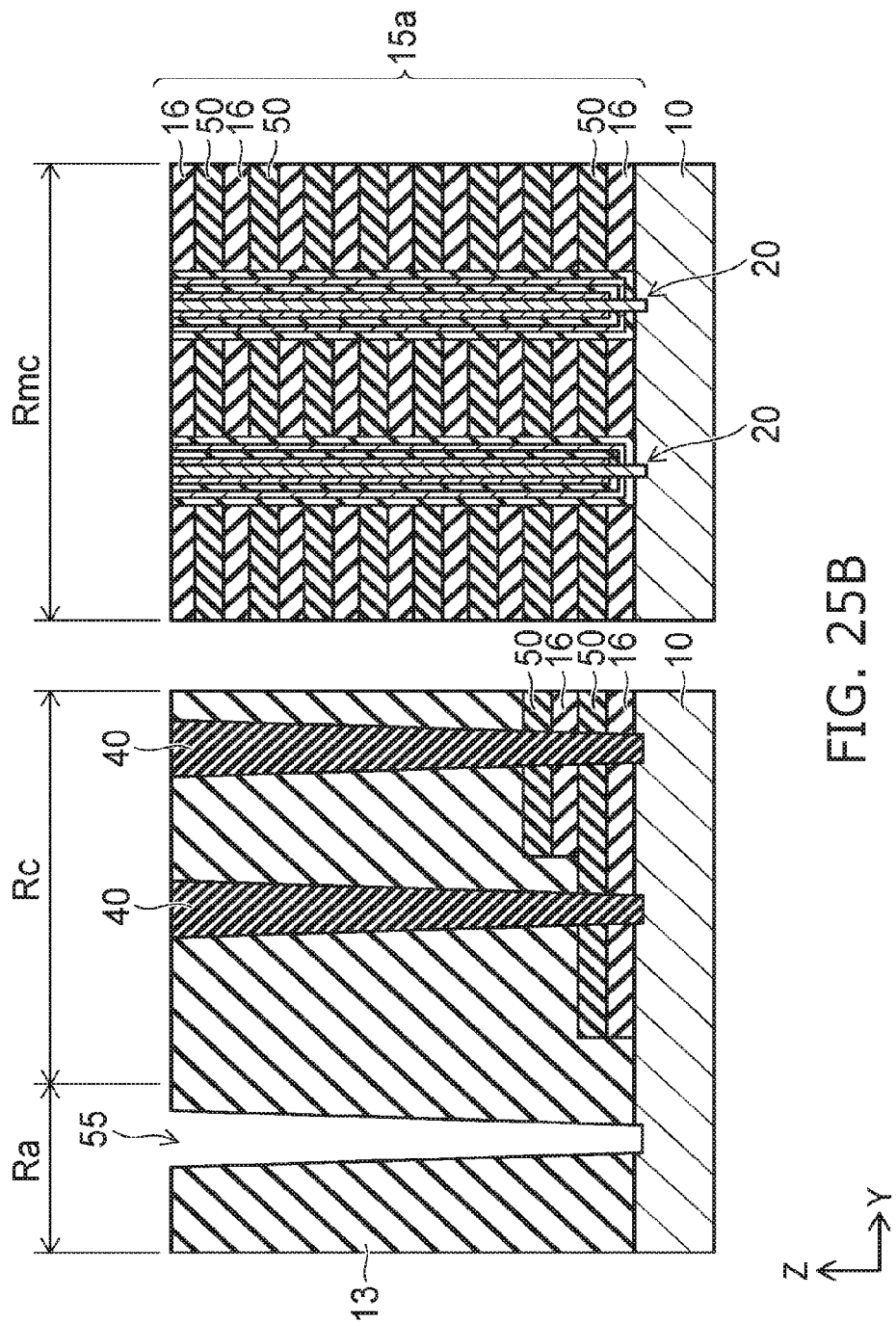

As illustrated in FIGS. 25A and 25B, a trench 55 is formed in the support region Ra using photolithography method and RIE, for example. The trench 55 is also formed in the peripheral region Rs (not illustrated in the figures). The trench 55 extends in the X-direction and the Z-direction through the insulating film 13. Moreover, the trench 55 partially extends into the silicon substrate 10.

Figure 26A:
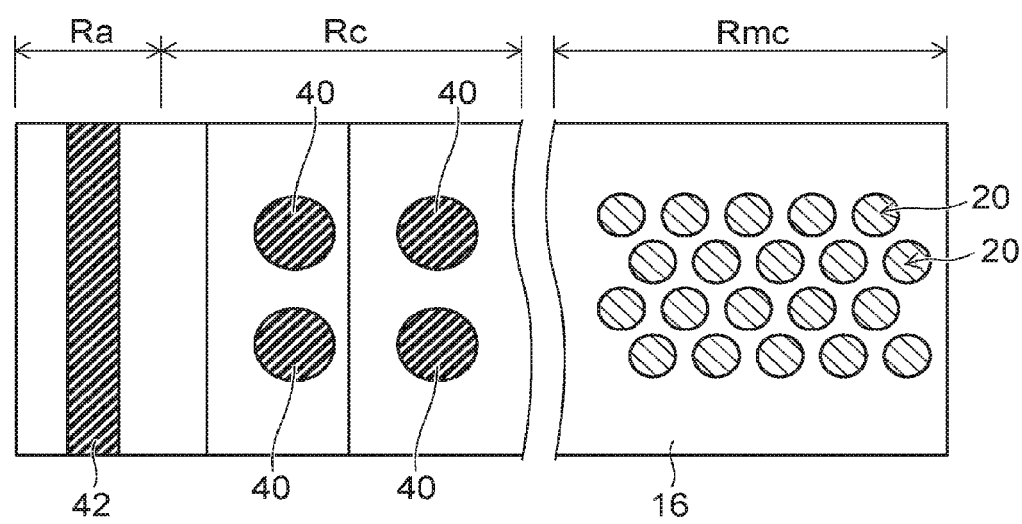
Figure 26B:
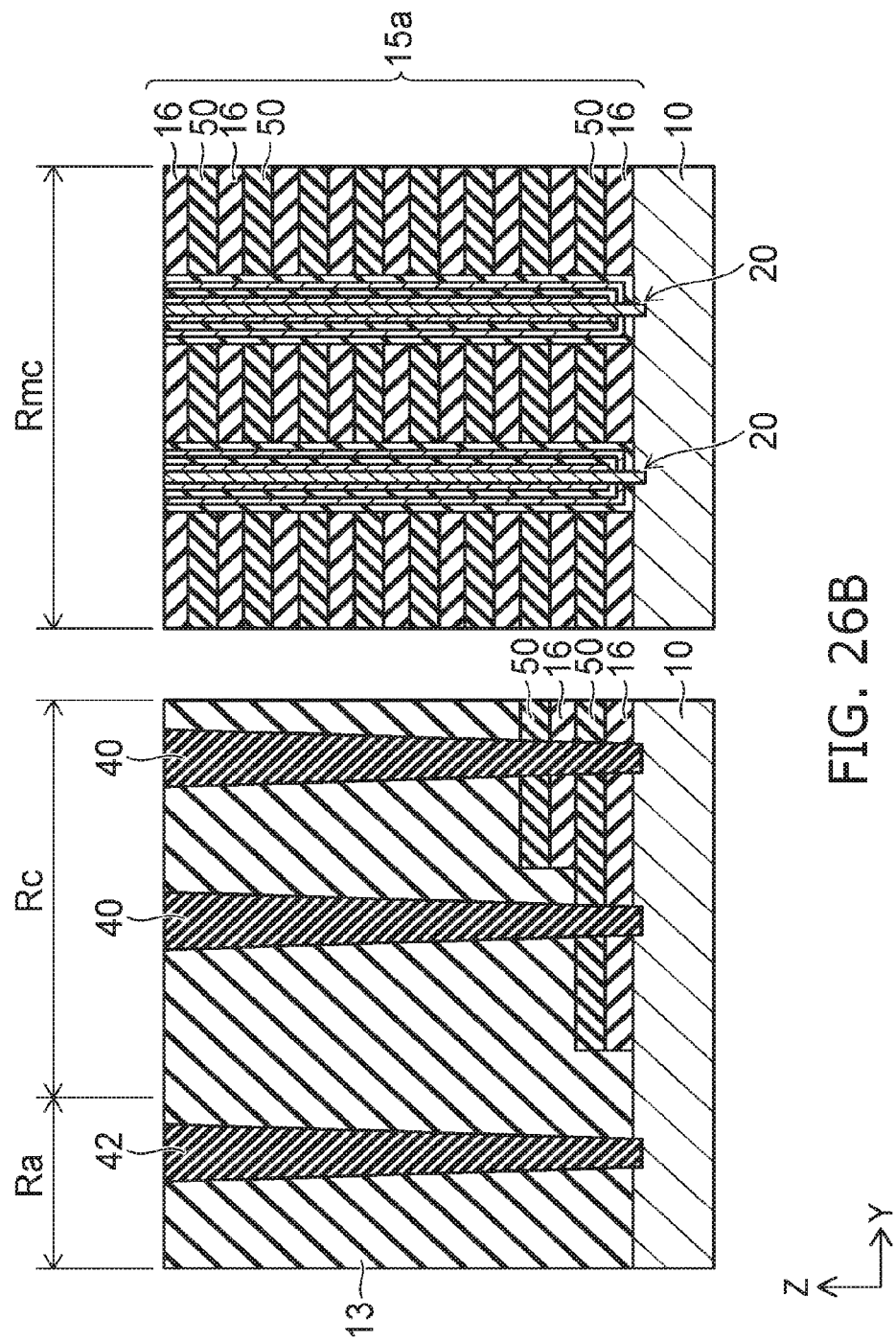

As illustrated in FIGS. 26A and 26B, silicon oxide is deposited inside the trench 55 using a method such as CVD in order to form the plate-shaped member 42. The plate-shaped member 42 is embedded in the silicon substrate 10.

Figure 27A:
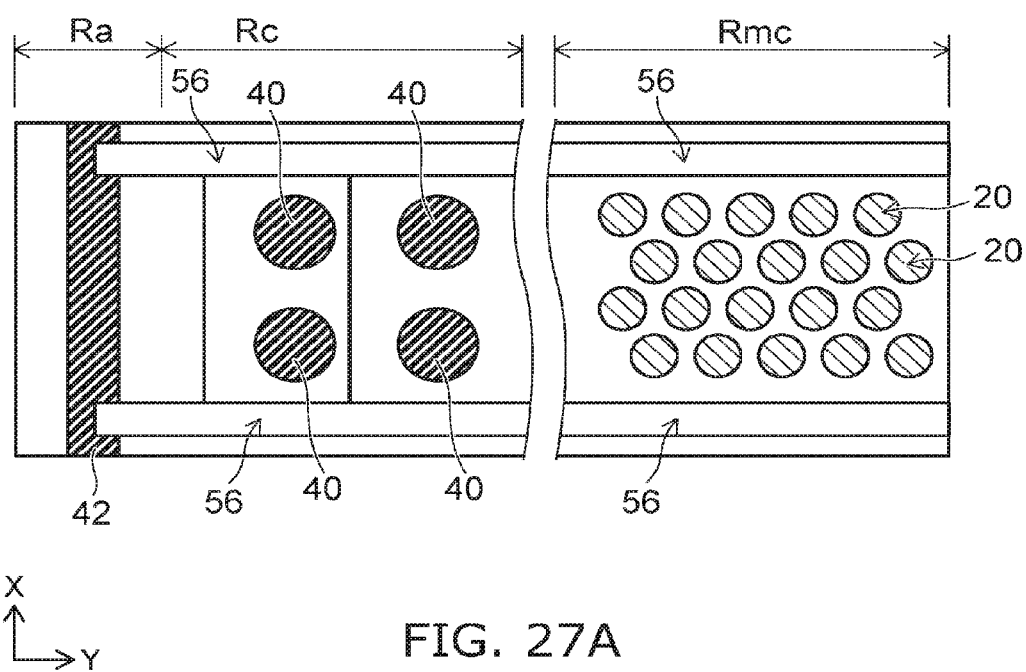
Figure 27B:
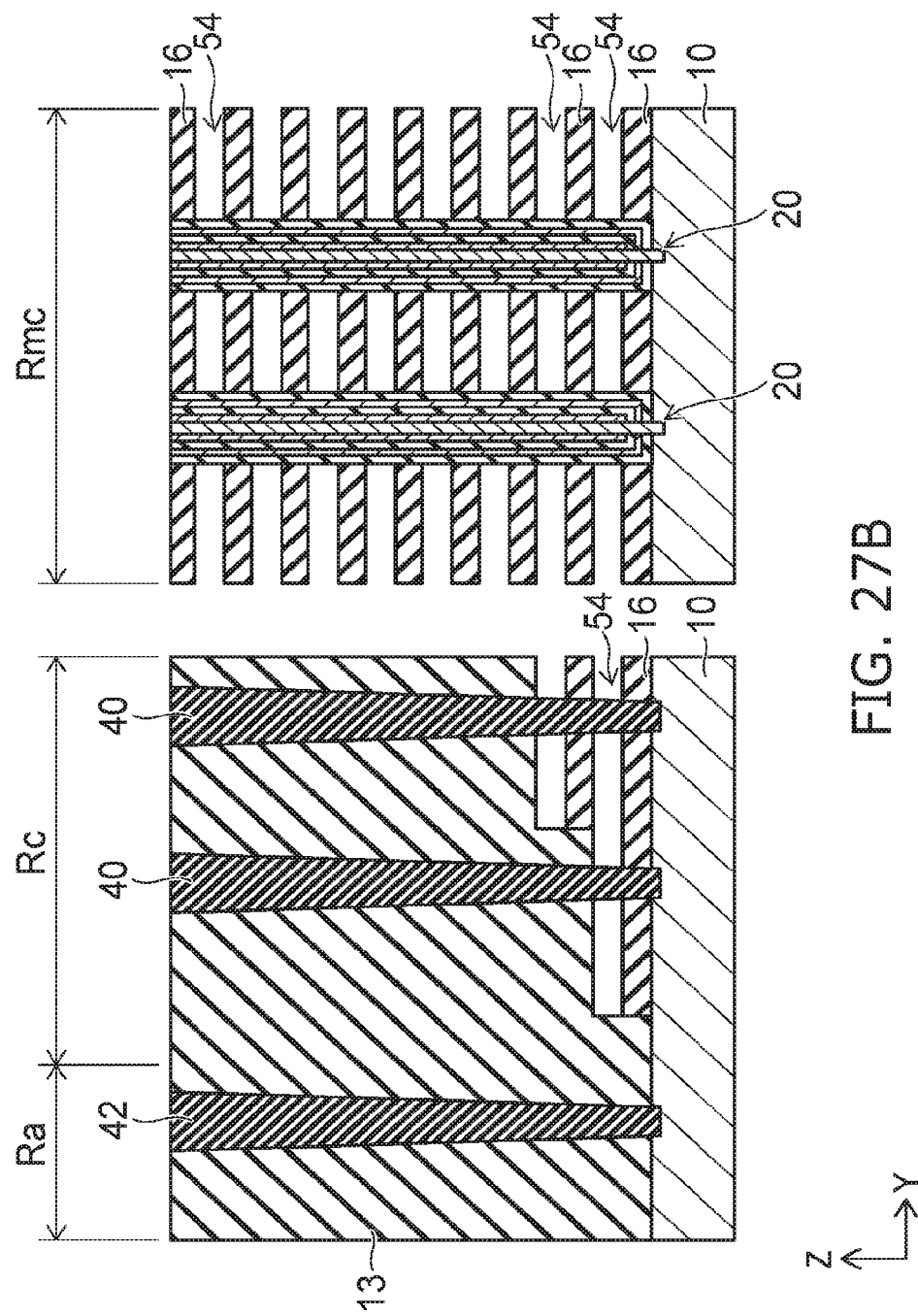

As illustrated in FIGS. 27A and 27B, a plurality of slits 56 extending in the Y-direction is formed in the stacked body 15a using an anisotropic etching process such as RIE. The slits 56 go through the entire stacked body 15a. Moreover, the slits 56 partially extend into the plate-shaped member 42. Next, a wet etching process is performed through the slits 56 to remove the sacrificial films 50. Removing the sacrificial films 50 through the slits 56 forms cavities 54.

Figure 28A:
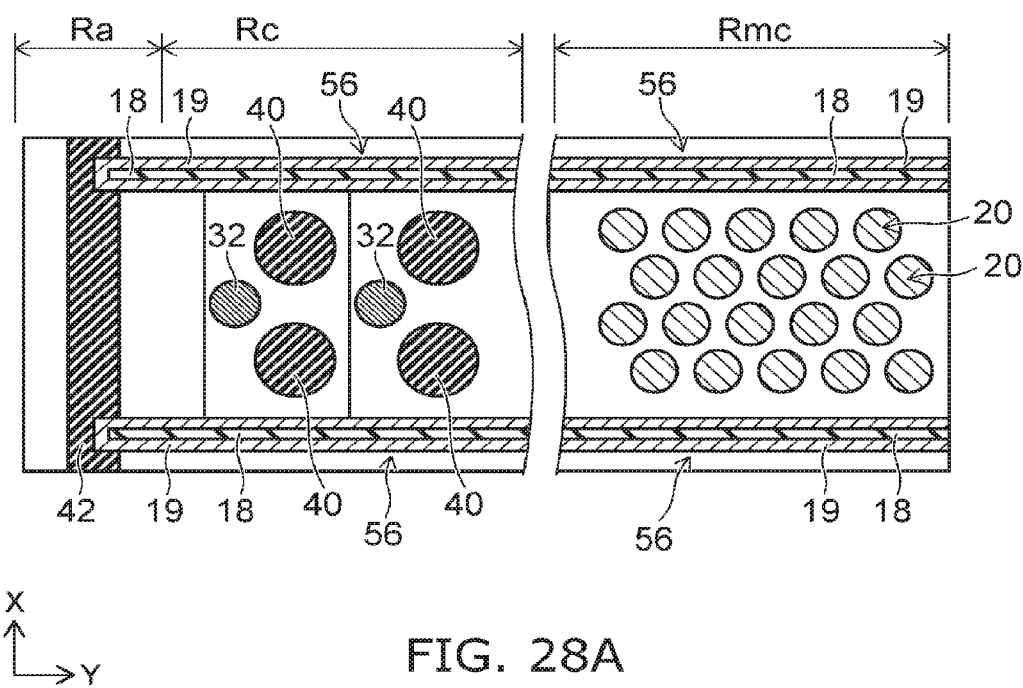
Figure 28B:
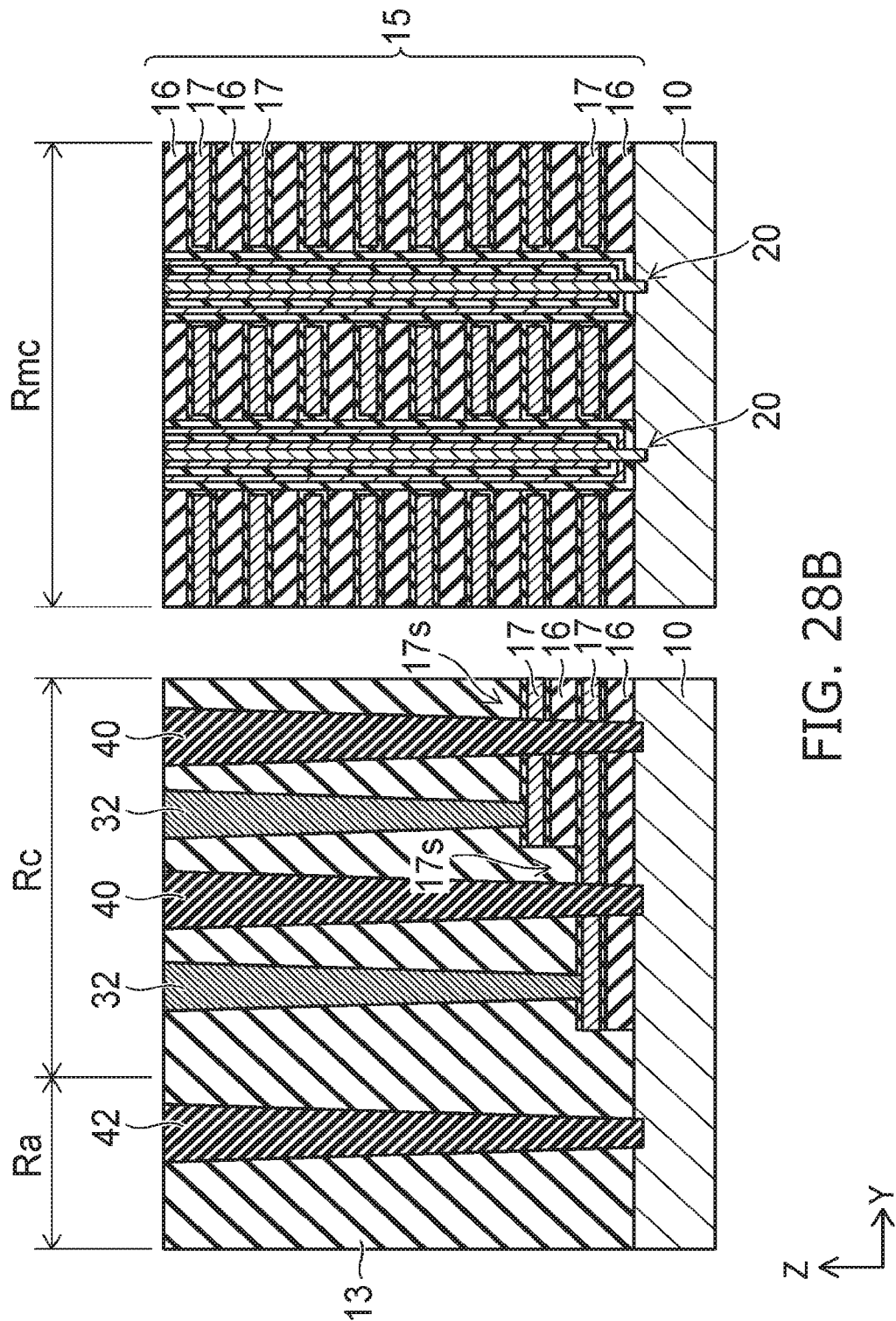

As illustrated in FIGS. 28A and 28B, conductive films made from a material such as tungsten or molybdenum are deposited through the slits 56 in order to fill in the cavities 54. In this way, the electrode films 17 are formed. Replacing the sacrificial films 50 with the electrode films 17 completes formation of the stacked bodies 15 between the slits 56. Next, the insulating films 19 are formed on the side faces of the slits 56, and layers of tungsten or molybdenum are deposited to form conductive films. In this way, the source electrodes 18 are formed inside the slits 56. Then, in the contact region Rc, the insulating film 12 (not illustrated in the figures) is formed on top of the insulating film 13, and contact holes are formed in a region directly above the steps 17s of the electrode films 17. Next, the contact holes are filled with a conductive material such as tungsten in order to form the contacts 32 inside the contact holes.

This completes the manufacture of the semiconductor memory device 100 according to the fifth embodiment.

Next, the effects of the fifth embodiment will be described.

In the fifth embodiment, the plate-shaped member 42 is provided in the support region Ra of the memory region Rm. Providing the plate-shaped member 42 in this way makes it possible to suppress the stacked bodies 15a from warping and causing the electrode films 17 to deform when removing the sacrificial films 50 through the slits 56 to form the cavities 54 in order to replace the sacrificial films 50 with the electrode films 17. When forming the cavities 54, for example, if stress or the like is created in the Y-direction in the electrode films 17, the plate-shaped member 42 functions as a stopper film that suppresses deformation of the electrode films 17. Moreover, embedding a portion of the plate-shaped member 42 in the silicon substrate 10 makes it possible to suppress the stacked bodies 15a from warping and causing the electrode films 17 to deform. In this way, a uniform shape can be maintained for each of the electrode films 17 from the upper layers to the lower layers, thereby substantially eliminating differences in the resistance of each electrode film 17. This, in turn, makes it possible to prevent issues due to differences in the memory operating characteristics of each memory cell due to differences in the electrode films 17.

Next, another variation of the fifth embodiment will be described.

Figure 29A:
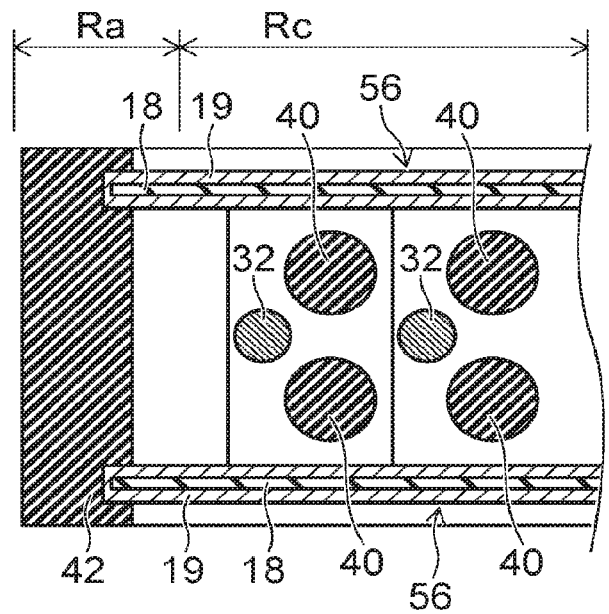
FIGS. 29A and 29B illustrate partial plan and partial cross-sectional views of a semiconductor memory device according to another variation of the fifth embodiment.
Figure 29B:
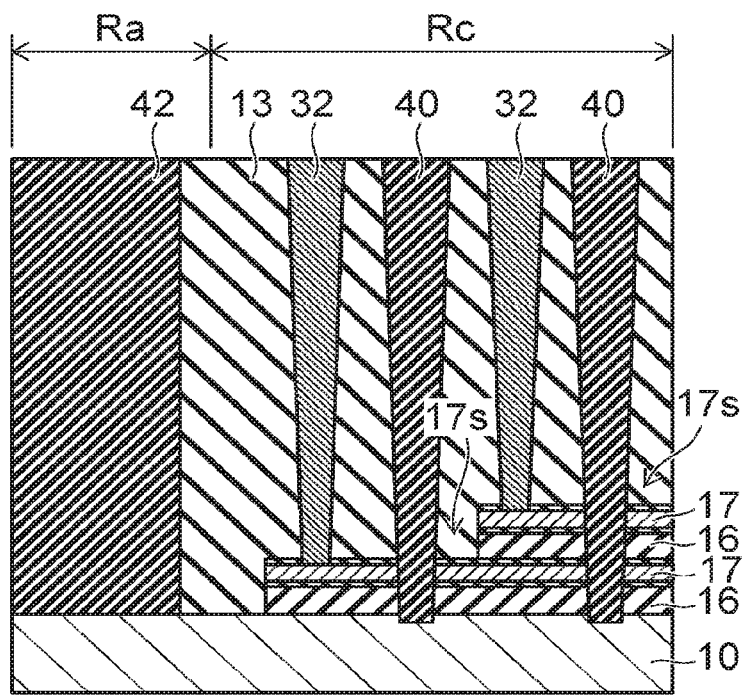

FIGS. 29A and 29B are enlarged plan and cross-sectional views of a part of the semiconductor memory device 100. A region illustrated in FIG. 29A is the contact region Rc and the support region Ra in FIG. 28A, and, a region illustrated in FIG. 29B is the contact region Rc and the support region Ra in FIG. 28B.

As illustrated in FIGS. 29A and 29B, the plate-shaped member 42 and the insulating film 13 are provided in the support region Ra such that the plate-shaped member 42 contacts the insulating member 13. The plate-shaped member 42 is positioned in the support region Ra such that the plate-shaped member 42 has a prescribed width from one end of the support region Ra. The insulating film 13 is positioned in the support region Ra such that the insulating film 13 has a prescribed width from the other end of the support region R1. One end of the support region Ra is positioned at the boundary (refer to FIG. 22) between the peripheral region Rs and the support region Ra arranged along the Y-direction. The other end of the support region Ra is positioned at the boundary between the contact region Rc and the support region Ra arranged along the Y-direction.

As illustrated in FIG. 29A, a portion of each source electrode 18 and a portion of each insulating film 19 that extend in the Y-direction are positioned within the plate-shaped member 42. However, the portions do not necessarily have to be positioned within the plate-shaped member 42.

As compared with the case where the plate-shaped member 42 is sandwiched by the insulating film 13 in the support region Ra, in the case where the plate-shaped member 42 is positioned in the support region Ra such that the plate-shaped member 42 has a prescribed width from one end of the support region Ra, it is possible to simplify each step of forming the plate-shaped member 42. In other words, as illustrated in FIGS. 25A-25B and 26A-26B, in the case of forming the plate-shaped member 42 inside the trench 55, it is possible to easily perform the alignment of a mask pattern in the photolithography method, thereby easily forming the trench 55.

The embodiments described above make it possible to provide a semiconductor memory device in which deformation of the electrode films can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a substrate;
   a stacked body provided on the substrate and in which a plurality of first insulating films and a plurality of electrode films are layered together alternately; and
   a columnar member including a semiconductor pillar and a memory portion, the semiconductor pillar extending in a first direction, the semiconductor pillar being provided in the substrate and the stacked body, the semiconductor pillar being electrically connected to the substrate, the memory portion being provided between the semiconductor pillar and one of the plurality of electrode films,
   a width of a first portion of the columnar member in a second direction being greater than a width of a bottom end of the columnar member in the second direction, the first portion being positioned on the same plane as an interface between the substrate and the stacked body, the second direction being parallel to a surface of the substrate and crossing the first direction.

2. The device according to claim 1, wherein the width of the first portion of the columnar member in the second direction is greater than a width of a second portion of the columnar member in the second direction, the second portion is surrounded by a lowermost one of the plurality of electrode films.

3. The device according to claim 1, wherein the width of the first portion of the columnar member in the second direction is a local maximal value along the first direction.

4. The device according to claim 1, wherein when viewed in a cross-section taken in a direction orthogonal to the surface of the substrate, a portion of the columnar member disposed in the substrate has a polygonal shape.

5. The device according to claim 1, wherein the bottom end of the columnar member is positioned at a depth of greater than or equal to 10 nm beneath an interface between the substrate and the stacked body.

6. The device according to claim 1, wherein
   the semiconductor pillar includes:
      a third portion contacting the substrate; and
      a fourth portion disposed in the stacked body, and
   a width of the fourth portion in the second direction is greater than a width of the third portion in the second direction.

7. The device according to claim 1, wherein the bottom end of the columnar member is a bottom end of the semiconductor pillar.

8. The device according to claim 1, wherein the columnar member further includes a second insulating film provided in the substrate and positioned around the semiconductor pillar.

9. The device according to claim 8, wherein the top end of the second insulating film contacts the stacked body.

10. The device according to claim 8, wherein the second insulating film contains silicon oxide.

11. The device according to claim 8, wherein
the columnar member further includes a third insulating film provided between the semiconductor pillar and the stacked body and extending in the first direction, and
the second insulating film contacts the third insulating film.

12. The device according to claim 11, wherein
the memory portion includes a charge storage film,
the charge storage film extends in the first direction, and
the charge storage film is disposed between the semiconductor pillar and the second insulating film and between the semiconductor pillar and the third insulating film.

13. A semiconductor memory device, comprising:
a substrate;
a stacked body provided on the substrate and in which a plurality of first insulating films and a plurality of electrode films are layered together alternately; and
a columnar portion provided in the substrate and the stacked body, the columnar portion including a semiconductor pillar and a second insulating film, the semiconductor pillar extending in a first direction, the semiconductor pillar being electrically connected to the substrate, the second insulating film being provided around the semiconductor pillar,
the columnar portion including a first portion positioned on the same plane as an interface between the substrate and the stacked body, and
a width of the first portion of the columnar portion in a second direction being greater than a width of a bottom end of the columnar portion in the second direction, the second direction being parallel to a surface of the substrate and crossing the first direction.

14. The device according to claim 13, wherein
the columnar portion further includes a second portion positioned in the stacked body, and
the width of the second portion of the columnar portion in the second direction is greater than the width of the bottom end of the columnar portion in the second direction.

15. The device according to claim 13, wherein
the columnar portion further includes a third portion positioned in the substrate, and
when viewed in a cross-section taken in a direction orthogonal to the surface of the substrate, the third portion has a polygonal shape.

16. The device according to claim 13, wherein the bottom end of the columnar portion is positioned at a depth of greater than or equal to 10 nm beneath an interface between the substrate and the stacked body.

17. The device according to claim 13, wherein the second insulating film contains silicon oxide.

18. The device according to claim 13, wherein the columnar portion further includes a charge storage film provided between the semiconductor pillar and the second insulating film and extending in the first direction.

19. The device according to claim 13, wherein a bottom end of the columnar member is a bottom end of the semiconductor pillar.

* * * * *